(12) United States Patent
Almy

(10) Patent No.: US 10,298,171 B2
(45) Date of Patent: May 21, 2019

(54) HINGED BUILDING INTEGRATED PHOTOVOLTAIC ROOF TILE MODULES

(71) Applicant: Tesla, Inc., Palo Alto, CA (US)

(72) Inventor: Charles Almy, Berkeley, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 15/712,113

(22) Filed: Sep. 21, 2017

(65) Prior Publication Data
US 2019/0089293 A1 Mar. 21, 2019

(51) Int. Cl.
*H02S 20/25* (2014.01)
*H02S 30/10* (2014.01)

(52) U.S. Cl.
CPC .............. *H02S 20/25* (2014.12); *H02S 30/10* (2014.12); *Y02B 10/12* (2013.01)

(58) Field of Classification Search
CPC .......... H02S 20/25; H02S 30/10; Y02B 10/12
See application file for complete search history.

(56) References Cited

U.S. PATENT DOCUMENTS

| | | | |
|---|---|---|---|
| 5,720,452 A * | 2/1998 | Mutschler, Jr. | ........ B64G 1/222 136/245 |
| 8,222,518 B2 | 7/2012 | Kelly | |
| 8,418,415 B2 | 4/2013 | Shiao et al. | |
| 8,438,796 B2 | 5/2013 | Shiao et al. | |
| 8,458,967 B2 | 6/2013 | Kalkanoglu et al. | |
| 8,468,754 B2 | 6/2013 | Railkar et al. | |
| 8,863,451 B2 | 10/2014 | Jenkins et al. | |
| 9,391,223 B2 | 7/2016 | Langmaid et al. | |
| 9,882,330 B2 * | 1/2018 | Kalman | ................. H01R 35/04 |
| 2005/0178430 A1 * | 8/2005 | McCaskill | ................ E04D 1/26 136/251 |
| 2009/0159118 A1 | 6/2009 | Kalkanoglu et al. | |
| 2009/0242015 A1 | 10/2009 | Wattman et al. | |
| 2010/0180523 A1 | 7/2010 | Lena et al. | |
| 2011/0017278 A1 | 1/2011 | Kalkanoglu et al. | |
| 2011/0225904 A1 * | 9/2011 | Railkar | ................. E04D 12/004 52/173.3 |
| 2011/0314751 A1 * | 12/2011 | Jette | ........................ F24J 2/523 52/173.3 |
| 2016/0056319 A1 | 2/2016 | Hachtmann et al. | |

FOREIGN PATENT DOCUMENTS

| DE | 102010034841 B4 | 2/2012 |
|---|---|---|
| EP | 2617914 A1 | 7/2013 |
| EP | 2672197 A1 | 12/2013 |

* cited by examiner

*Primary Examiner* — Jeanette E Chapman
(74) *Attorney, Agent, or Firm* — Kilpatrick Townsend & Stockton LLP

(57) ABSTRACT

Building integrated photovoltaic (BIPV) systems provide for solar panel arrays that can be aesthetically pleasing to an observer. BIPV systems can be incorporated as part of roof surfaces as built into the structure of the roof, particularly as multi-region roofing modules that have photovoltaic elements embedded or incorporated into the body of the module, in distinct tiles-sized regions. Such multi-region photovoltaic modules can replicate the look of individual roofing tiles or shingles. Further, multi-region photovoltaic modules can include hinged support structures along the upper edge of the modules, allowing for lifting of portions of an installed module, giving access to the underlying roof deck for more efficient installation, maintenance, or removal of roofing structures down-roof of the installed module.

36 Claims, 10 Drawing Sheets

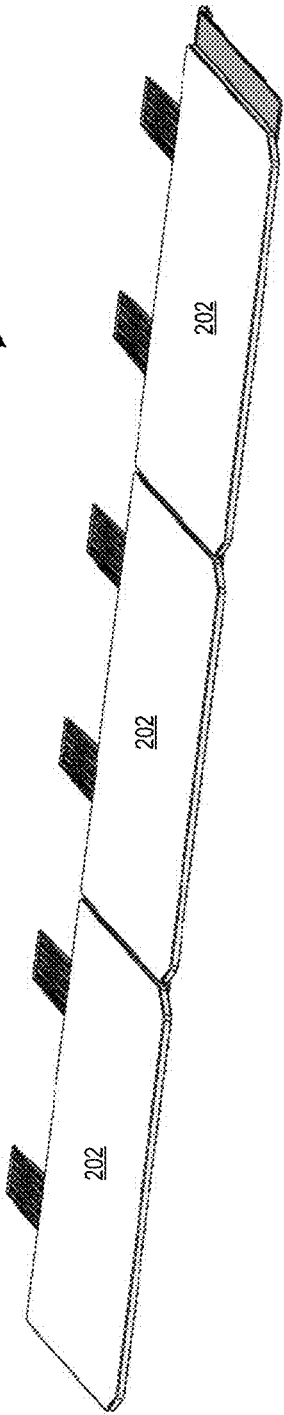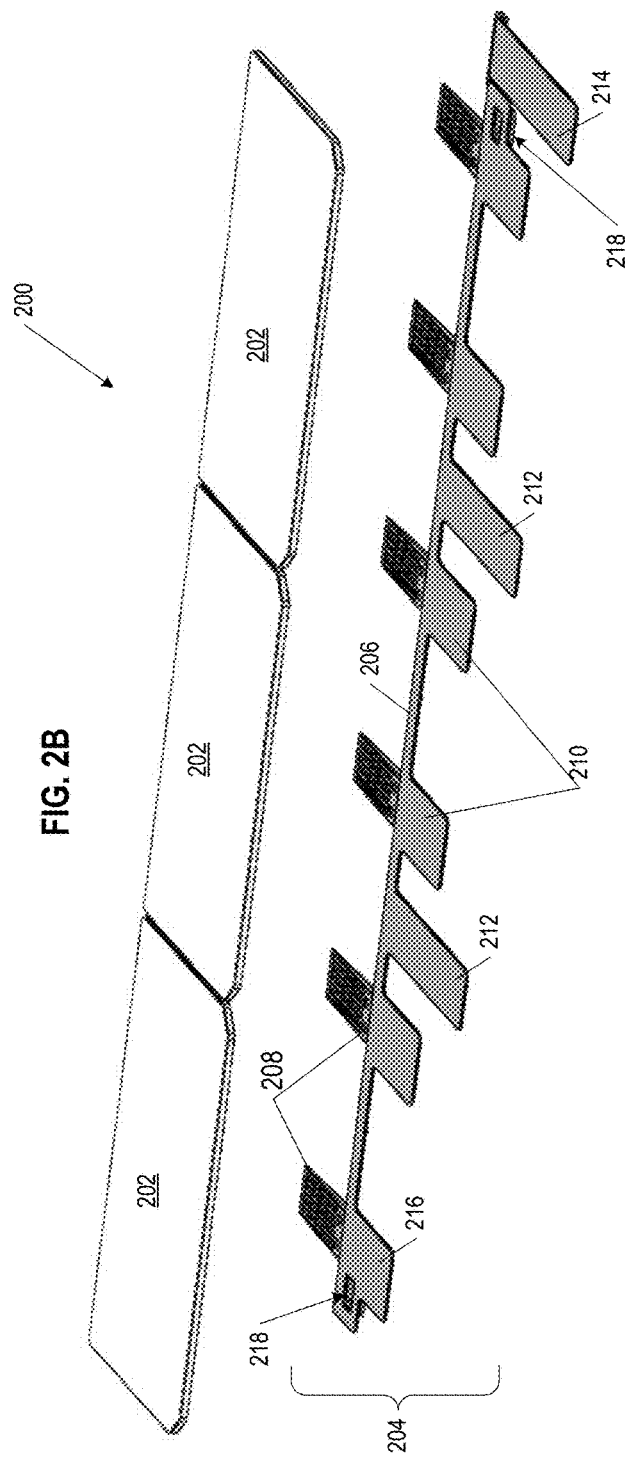
FIG. 2A
FIG. 2B

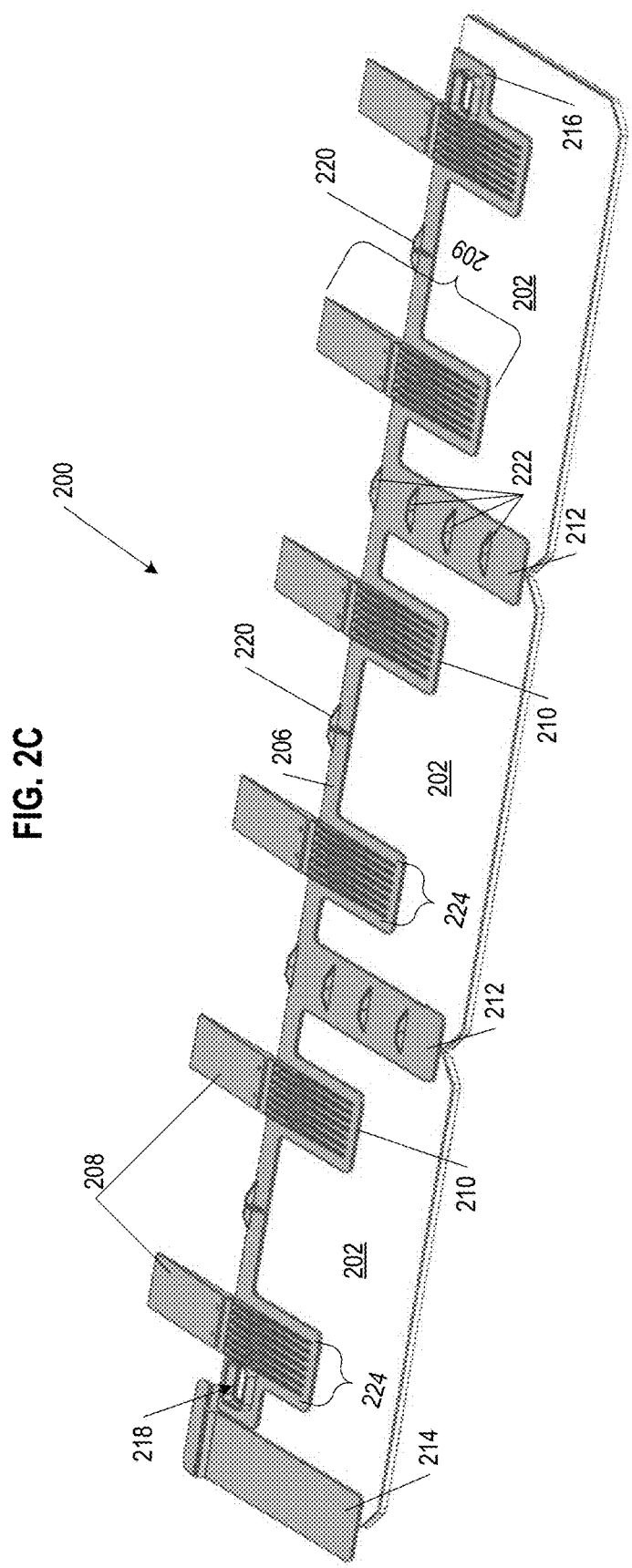

HINGED BUILDING INTEGRATED PHOTOVOLTAIC ROOF TILE MODULES

CROSS-REFERENCE TO RELATED APPLICATIONS

N/A.

TECHNICAL FIELD

This generally relates to photovoltaic arrays.

BACKGROUND

Solar is becoming increasingly popular in the United States and abroad, but penetration remains relatively low versus the number of homes that could benefit from solar. The price per kilowatt for solar is now competitive with or below that of fossil fuel-based utility power in most areas, however, solar largely remains a niche product for those who value saving money, reducing $CO_2$ emissions, or both.

One factor that may limit the adoption of solar technology is aesthetics. Most residential solar systems are installed as modules over an existing tile or composition shingle roof. The solar array, which often only covers a portion of the roof, or even a portion of one mounting plane of the roof, stands out as separate and distinct from the existing roof, both in height and material. This difference is therefore visible from the street level and even over large distances.

Further, the time and complexity of a solar array installation can be an obstacle to the adoption of solar technology. Many improvements have been made to streamline and improve the process of installing, mounting, and connecting individual solar panels, but there remains an opportunity for innovating and even better refining the systems and methods of installing different types of photovoltaic arrays.

Another obstacle to solar adoption in existing homes is the dissonance between the age of the existing roof and the solar system, particularly where the existing roof is made from composition shingles. The expected life of a modern-day solar system is 25 years or more, and the expected life of a composition shingle roof is also about 25-35 years, depending on the local climate and specific materials. At the time a customer is considering going solar, their existing roof may be several years, if not decades, into that lifespan. So the customer may be presented with the dilemma of getting a new roof first, increasing the cost of going solar, or installing a 25-year solar system on a roof which may have a relatively shorter remaining operational lifespan.

Accordingly, there is a need to resolve the dissonance between the expected life of the solar system and the remaining life of the roof that also blends in more aesthetically with the complete roof surface or at least the mounting plane, and that does not require the prospective customer to pay for a new roof and a new solar system over that roof.

BRIEF SUMMARY

Various embodiments provide a new and improved approach to installing solar on new roofs and existing roofs, and in particular, presenting a roof that appears to be a tile roof. Some aspects fit over an existing tile roof and/or other suitable roof surfaces (e.g., a metal roof, composite shingle, roof deck, underlayment or insulation layer). In particular, aspects of the disclosure are modular and flexible, which simplifies installation as well as replacement of individual photovoltaic modules of the system. In addition, some aspects cost less to make and install compared to conventional solar systems. Further, some arrangements of photovoltaic portions (and/or non-photovoltaic portions) of modules can generate a visual pattern and aesthetic that appears consistent with traditional roofing materials. Moreover, with a hinged structure to facilitate installation and assembly of photovoltaic modules, great advantages can be had in reducing the number of (or even eliminating) battens beneath the photovoltaic modules forming a solar array. Indeed, with a hinged structure, photovoltaic modules can be efficiently installed in a down-roof direction. Some solar systems can be installed as a new roof rather than a re-roof or mounted to an existing roof. These and other embodiments are discussed in greater detail in the detailed description and drawing figures.

In some embodiments, the present disclosure is directed toward a hinged multi-section solar or photovoltaic module having a plurality of photovoltaic elements including: two or more photovoltaic tiles, each photovoltaic tile having at least one solar cell; and a support skeleton. In some aspects, the support skeleton is formed having: a spine structure defining a longitudinal axis; a plurality of midsection supports, extending from the spine, configured to extend under gaps between the two or more photovoltaic glass tiles; and one or more flexure hinges extending from the spine, each flexure hinge having a hinge foot configured to secure to a roof deck and a hinge leg configured to bond to one of the photovoltaic glass tiles. In various aspects, the support skeleton can be made of a polymer, where the polymer can be polyphenyl ether (PPE), polystyrene (PS), poly(methyl methacrylate) (PMMA), an acetyl, a polycarbonate, or a combination thereof. In other aspects, each section of the support skeleton can be about two millimeters (2 mm) thick, where for example, each of the hinge foot, the spine, the hinge leg, or the midsection supports as individually measured can be about two millimeters (2 mm) thick. In further aspects, each photovoltaic glass tile can be bonded to two flexure hinges. In some aspects, the spine further includes an inline-brace positioned between adjacent photovoltaic tiles.

In some embodiments the hinge leg and hinge foot of the flexure hinge are connected by a bridge structure. In other aspects, the hinge leg can further have stiffening ribs that extend along of the length of the hinge leg, where in some such aspects, the stiffening ribs can be from about 25% to about 95% of the length of the hinge leg. In further aspects, the hinge leg can be from about 25% to about 100% of the length of the hinge foot. In another aspect, the hinge foot can be about twice, about three times, about four times, or about equal to the length of the hinge leg. In some aspects, the flexure hinge can a range of motion allowing for bending up to a 10°, 20°, 45°, or 90° angle from a flat configuration (or relative to the plane of a roof deck).

In other embodiments, the present disclosure is directed toward course of a building integrated photovoltaic array, including: a plurality of photovoltaic modules, arranged in a horizontal row on a roof deck, wherein the photovoltaic modules are attached through a plurality of flexure hinges to the roof deck; and an electrical box, electrically connected to the plurality of photovoltaic modules. In such aspects, each photovoltaic module can further include: three photovoltaic tiles, each photovoltaic tile having at least one solar cell, each of the photovoltaic tiles being electrically connected to each other; a support skeleton having a spine, wherein the three photovoltaic tiles are arranged linearly along the support skeleton, with the support skeleton coupled to the underside of the upper edges of the three photovoltaic tiles; a plurality of midsection supports, extending from the spine, configured to extend under two gaps between the three linearly arranged photovoltaic tiles; and three pairs of flexure hinges extending from the spine, where each of the three photovoltaic tiles has one of the pairs of flexure hinged adhered to the underside of the respective photovoltaic tile. In some aspects, each flexure hinge can have hinge foot and a hinge leg, where the hinge foot is directly secured to the roof deck, such as with screws. In other aspects, each photovoltaic tile further comprises a sealant material on the underside of the photovoltaic tile, arranged to be in between the midsection supports. In other aspects, the photovoltaic tiles can be held in cantilever by the flexure hinges over a relatively down-roof region of roof deck. In further aspects, the support skeleton can have a tail end flange that is configured to partially support to a horizontally adjacent member of the plurality of photovoltaic modules.

In further embodiments, the present disclosure is directed toward a method of installing a building integrated photovoltaic array, including the steps of: installing framing structures on a roof deck; positioning and securing a first course of solar roofing modules proximate to a ridge of the roof; positioning and securing successive subsequent courses of solar roofing modules, progressively down-roof along the roof deck, according to a slope of the roof deck; positioning and securing a bottom-most course of solar roofing modules proximate to an eave of the roof; and electrically connecting each course of said PV modules to a local power grid. In some aspects, the method can include the steps of lifting the photovoltaic tiles of an up-roof solar roofing module within the range of motion of a plurality of flexure hinges coupled to the photovoltaic tiles; placing and installing the subsequent solar roofing module to the roof deck in a position down-roof of the up-roof solar roofing module; and lowering the photovoltaic tiles of the up-roof solar roofing module into place, such that each of flexure hinges are in a coupled configuration. In other aspects, the method can include the step of placing the progressively down-roof course of solar roofing modules at a variable position along the slope of the roof deck, such that the down-roof course of solar roofing modules has a specifically adjusted reveal area.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive

FIG. 2A shows a schematic top perspective view of an exemplary hinged multi-section photovoltaic module, in accordance with aspects of the disclosure.

FIG. 2B shows a schematic exploded view of the hinged multi-section photovoltaic module as shown in FIG. 2A, in accordance with aspects of the disclosure.

FIG. 2C shows a schematic bottom perspective view of the hinged multi-section photovoltaic module as shown in FIG. 2A, in accordance with aspects of the disclosure.

DETAILED DESCRIPTION

Figure 1A:
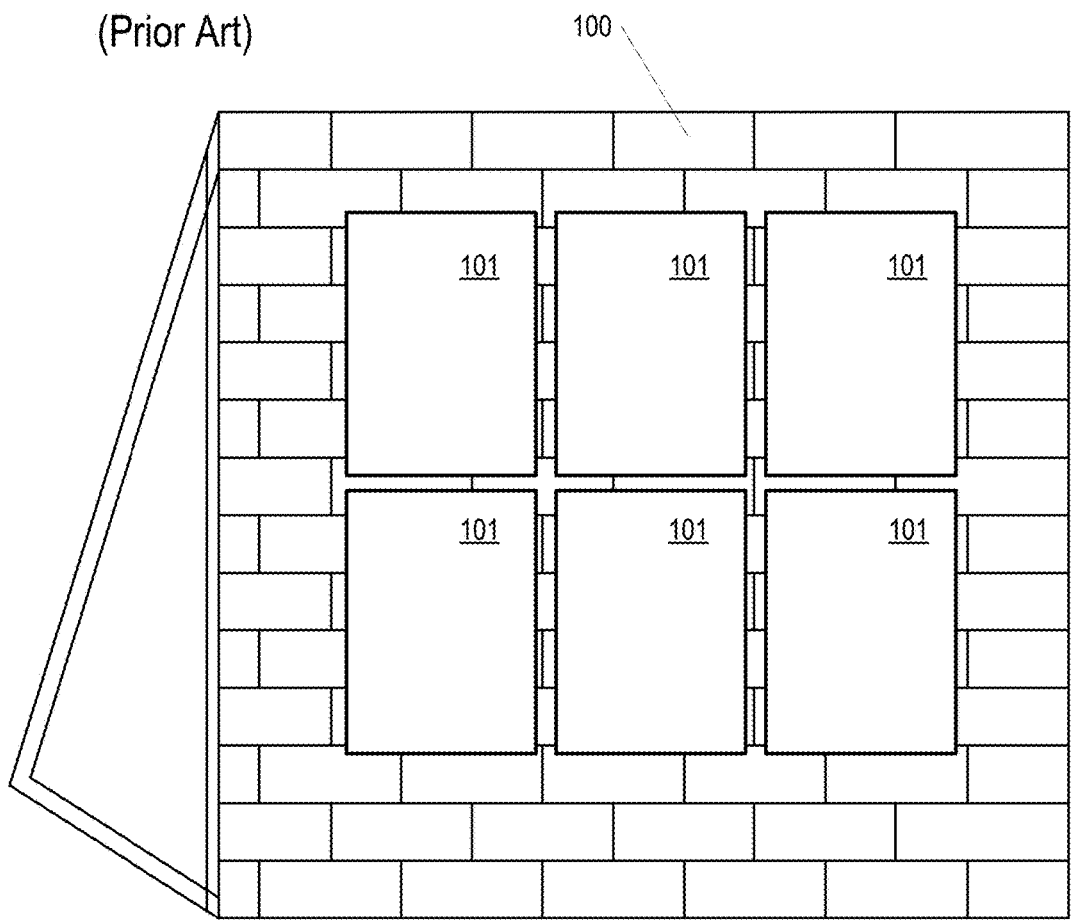
FIG. 1A shows an example of a prior art photovoltaic array installed on a roof.

The present disclosure describes various embodiments of photovoltaic roofing systems and associated systems and methods, and in particular building integrated photovoltaic roofing systems. Some embodiments relate to building integrated photovoltaic module assemblies and associated systems and methods. In various embodiments, the systems described herein lower costs of conventional systems in which a photovoltaic ("PV") system is installed over a roof, and at the same time can provide an improved aesthetic for a PV roof system, and particularly for a building integrated photovoltaic ("BIPV") system.

Certain details are set forth in the following description and in the Figures to provide a thorough understanding of various embodiments of the present technology. Other details describing well-known structures and systems often associated with PV systems, roofs, etc., however, are not set forth below to avoid unnecessarily obscuring the description of the various embodiments of the present technology.

There is a constant need to improve upon the speed and efficiency of the installation process of PV systems, the visual aesthetic of an installed PV array, as well as the resilience and operational lifetime of PV systems and arrays. Innovations as considered by the present disclosure employ a hinged multi-section PV module, generally spanning a width equal to three PV tiles (or shingles), that provides for a structural component that reduces installation time, is visually appealing, and includes non-rigid features that can improve upon the functional lifespan of each PV module. In particular, the range of motion of the hinge, considered alternatively or in combination with, the flexibility of the multi-section PV modules disclosed herein allows for an ease of installation due to the slack and ability to adjust the edges of the PV modules, and the ability to wedge in hinge structures underneath adjacent up-roof courses of PV modules, as they are being arranged as part of an array. This improves upon the installation and assembly process which generally takes less time than assembly of a traditional, rigid PV structure. Further, the hinged multi-section PV module having a form factor equivalent to having three PV tiles built into the module, but distinct from each other and spaced to appear as if they are physically separate, improves the installation time (installing "three PV tiles" at once as opposed to only one at a time) and reduces connector counts over individual roof tiles, while concurrently presenting a visually pleasing roof structure to an average observer. The flexibility of the hinged multi-section PV modules can result in a structure that can better withstand environmental strains (e.g., wind shear, uplift, thermal expansion & contraction, etc.) and uneven roof surfaces due to the range of tilting freedom provided between paired solar cells or PV tiles of the multi-section PV module. Particularly, the hinged multi-section PV modules of the present disclosure have a spine-like support structure on which hinge-like structures are positioned, providing a degree of between the support structure and the PV tiles coupled to the support structure, allowing the support structure to be secured to a roof deck before positioning the PV tiles into an installed configuration. Further details of these advantages are discussed below.

Many of the details, dimensions, angles and other features shown in the Figures are merely illustrative of particular embodiments. Accordingly, other embodiments can include other details, dimensions, angles and features without departing from the spirit or scope of the present disclosure. Various embodiments of the present technology can also include structures other than those shown in the Figures and are expressly not limited to the structures shown in the Figures. Moreover, the various elements and features shown in the Figures may not be drawn to scale. In the Figures, identical reference numbers identify identical, or at least generally similar, elements.

As used herein, the term "substantially" refers to the complete or nearly complete extent or degree of an action, characteristic, property, state, structure, item, or result. For example, an object that is "substantially" uniform in height to another object would mean that the objects are either completely or nearly completely uniform in height. The exact allowable degree of deviation from absolute completeness may in some cases depend on the specific context, however, generally speaking, the nearness of completion will be so as to have the same overall result as if absolute and total completion were obtained.

As used herein, the term "about" is used to provide flexibility to a numerical range endpoint by providing that a given value may be "above" or "below" the value. For example, the given value modified by about may be ±10% relative to the given value.

Wherever used throughout the disclosure and claims, the term "generally" has the meaning of "approximately" or "closely" or "within the vicinity or range of". The term "generally" as used herein is not intended as a vague or imprecise expansion on the term it is selected to modify, but rather as a clarification and potential stop gap directed at those who wish to otherwise practice the appended claims, but seek to avoid them by insignificant, or immaterial or small variations. All such insignificant, or immaterial or small variations should be covered as part of the appended claims by use of the term "generally".

As used herein, the term "building integrated photovoltaic system" or "BIPV" generally refers to photovoltaic systems integrated with building materials to form at least a portion of a building envelope. For example, the BIPV system can form the roof or roofing membrane of a building. The BIPV systems described herein can be retrofitted, can be a part of a new construction roof, or a combination of both. Such building integrated photovoltaic structures can be alternatively referred to as building integrable photovoltaic ("BIP") or building applied photovoltaics ("BAPV"). Components of a BIPV system used, in part, as part of the actual building envelope (e.g., roofing membrane), can provide a watertight or substantially watertight seal for the roof surface.

For the sake of distinguishing between structural elements of the present BIPV system, as used herein, the term "solar cell" refers to the structures of the system with solar energy collecting elements (often silicon elements), the term "PV roof tile" refers to such solar collecting elements as mounted or adhered to a single structural roof tile, and the term "PV module" refers to a set of solar cells, PV regions of a PV module, and/or other PV units that are mechanically and electrically connected to each other as part of a single structural unit. In the context of a PV module, the term "PV section" refers to sections of the PV modules that can each appear similar to a PV roof tile, and are configured to support solar cells similarly to a single PV roof tile.

As used herein, the terms "up-roof" and "down-roof" are used to provide orientation, direction, position, or a reference point relative to or in context of a roof or roofing surface upon which the systems described herein are installed on and/or from a portion of. Up-roof generally refers to an orientation or portion that is relatively closer to the roof ridge while down-roof refers to an orientation or portion that is relatively closer to the roof eave.

As used herein, the term "reveal" refers to the portion of a PV tile or PV module that is exposed sunlight and/or holds or mounts solar energy collecting elements, such as silicon-based solar cells. As used herein, conversely, the term "lapped" or "overlap" region refers to the section of a PV tile or PV module along its upper (up-roof) edge that, as part of a roofing installation, will be physically covered or underneath bottom surfaces (i.e. not exposed to sunlight) of the next adjacent, up-roof course of PV tiles, PV modules, or other roofing components.

As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below, depending on the context of its use. The device may be otherwise oriented (e.g., rotated 90° or at other orientations) and the spatially relative descriptors used herein are interpreted accordingly.

Although the terms "first", "second", etc. may be used herein to describe various elements, components, regions, layers and/or sections, it should be understood that they should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present disclosure.

As used herein, the terms "and/or" and "at least one of" include any and all combinations of one or more of the associated listed items.

Generally, PV modules include crystalline-based solar panels, which can be either or both of monocrystalline solar panels or polycrystalline (multi-crystalline) solar panels. The laminate or wafer forming the solar energy-collecting surface of such PV modules can be mechanically coupled, adhered, or bonded to structurally supporting tiles. In some embodiments, PV modules can include layers of amorphous silicon or thin film variations of solar energy-collecting laminates, or thin-film solar materials directly applied as continuous sheets. Generally, PV elements as considered herein, which can include solar cells and laminates, have individual structures that can be used in combination to form larger solar arrays and/or building structures such as PV modules, as set forth below. Alternatively, thin-film PV modules, such as cadmium telluride, copper-indium-gallium-diselenide ("CIGS"), or amorphous thin-film silicon may be used. In still further embodiments, cells based on perovskite or other as of yet non-commercialized materials may be used. The particular type of cell technology used for any given installation can be selected both for solar energy collecting functionality and for aesthetic qualities, as related to the present disclosure.

The module provides for improved ease of construction, as assembling (or disassembling) a PV array three tiles at a time is often quicker than assembling a similar PV array one tile at a time. In some alternative embodiments, the modules can have two tiles, four tiles, or five or more tiles (all connected in similar fashion as the embodiments described below, and all with similar structural and electrical connection considerations). A BIPV roofing system can use three-tile modules along with single PV tile components, where the single PV tiles can be placed on the roof at the edges or in locations where a three-tile modules may not fit due to size or arrangement on the underlying roof.

Moreover, the structure of the module allows for the assembly of a BIPV roof in a ridge-to-eave progression. Often, standard roof tiles (or shingles, or the like) are laid down in a eave (down-roof, bottom) to ridge (up-roof, top) order, as this is easier for setting down successive courses (rows) of tiles on top of each other, with the reveal of an up-roof course covering the lap (also referred to as the overlap) region of the immediately adjacent down-roof course. For prior PV tiles, this can be more problematic, as an installer is standing, sitting, kneeling, or otherwise putting force on the down-roof courses as they install the next up-roof course, potentially damaging the solar cells and/or PV tiles. Proceeding with an installation in the up-roof to down-roof direction, however, includes the challenge of having to tuck the lap of a down-roof course underneath the reveal of the immediately adjacent up-roof course. For the PV module of the present disclosure, due to its hinge and structure, the module can be tilted upward, providing for temporary access to the region that would be otherwise covered by an up-roof course, thus making installing a down-roof course less burdensome than normal.

Broadly, the structure of the PV module considered is a module with distinct solar energy collecting tile areas, where (1) the tile areas have separate glasses (2) that are connected by a "skeleton" on the underside of the lap of PV module, (3) with hinged structures anchoring the PV module to underlying roof, which does not require battens, and (4) with middle support sections on the underside of the PV module at gaps between each PV region glass, allowing for a degree of flexibility.

It can be understood that this structure allows for lifting up the PV glass (connected to the hinge leg) and thus provides a way to provide access to the roof deck or underlayment beneath the PV modules. This living hinge is formed to endure a limited number of strain cycles, primarily for installation, maintenance annually (or less frequently), and removal actions. Moreover, the flexure hinge of the present PV modules do not require additional or specialized tools to latch or lock (or unlatch or unlock) the PV module between coupled and uncoupled configurations, greatly improving the ease of assembly or disassembly of the PV modules as part of a BIPV array or system.

The cantilever structure of the hinged PV module provides for several advantages not otherwise available with other approaches to installing courses of PV tiles or PV modules. In one aspect, because the PV modules are anchored directly to the roof deck, no battens are needed for securing the modules. This advantage reduces each of cost, labor, and time by at least about 15%, compared to traditional roofing installations. In another aspect, the courses of PV modules are "floating" on top of each other, and unlike other array structures, do not require additional latching from one course to another along the slope of a roof. In other words, it is not needed, from a relatively up-roof course, to connect from the bottom-underside that course to a receiving structure on the upper edge of the immediately adjacent down-roof course. This allows for the spacing of an up-roof course over a down-roof course to be adjustable, thereby allowing for an adjustable reveal of the down-roof course. This provides for freedom in alignment, fitting in a target number of solar collecting courses, the height of lap regions, and flexibility in cutting portions of modules or tiles for flashing or to account for roof obstructions, among other advantages for construction and installing a solar array.

A roofing system using these modules will generally seek to optimize the distribution of the modules on the underlying roof, and can use single PV tiles to fill in gaps or edges of the overall BIPV array/system. These modules and PV tiles will further electrically connect to each other and to downstream power management systems.

The present disclosure is directed toward a particular implementation of a hinged multi-region PV module and further toward the assembling of PV arrays on a roof with such modules. In many embodiments, such PV arrays are configured as BIPV roofing systems. In several aspects, the present PV module is formed of three PV regions, each PV region having solar cells mounted therein. The number of solar cells supported by each PV tile or PV region can be one, two, three, four, five, six, seven, eight, nine, ten, twenty, twenty-four, thirty-two. The PV sections are generally configured linearly, giving the PV module an elongate shape. It is understood that PV modules as considered herein are not limited to three-PV section embodiments, but rather can also include modules having two, four, or more than four PV sections. Moreover, it should be appreciated that PV or BIPV arrays formed with such PV modules can also include single PV roof tiles deployed in combination with the PV modules, where appropriate for specific spacing, gaps, or edges of the overall PV array. Further, the junction or interface between each of the PV sections of a PV module is constructed to allow for flexibility and a degree of bending between adjacent PV sections, which provides for advantages in assembly and resilience over the lifetime of a PV array installation using such PV modules. In some aspects, the flexibility of PV modules at junctions between PV sections allows the PV modules to follow the contour of an underlying roof surface (which may not be perfectly flat), thereby forming a better fitting and more securely sealed roof envelope. As with standard structural roof tiles, for BIPV implementations, these construction elements are used to form the envelope of a roof, often as part of a re-roofing job replacing an existing roof, for example an original roof that has reached its end-of-life.

The hinged multi-section PV module according to the various embodiments of the disclosure provides for improved ease of construction, as assembling (or disassembling) a PV array with a structural unit three tiles wide is often quicker than assembling a similar PV array one tile at a time. In some alternative embodiments, the modules can have two tiles, four tiles, five tiles, or more than five tiles (all connected in similar fashion as the embodiments described below, and all with similar structural and electrical connection considerations). A BIPV roofing system can use three-tile-width hinged PV modules along with single PV tile components, where the single PV tiles can be placed on the roof at the edges or in locations where a three-tile-width hinged PV module may not fit due to size or arrangement on the underlying roof. The underlying roof structure, in combination with the hinged PV modules and single PV tile components, can form a roof envelope for a BIPV roofing system.

PV elements that are distributed over all roof surfaces can have a visual uniformity that is neat, generally continuous, and elegant. The separation between PV tile regions on PV modules and between adjacent PV modules can mimic the width and appearance of seams or breaks that would exist between adjacent conventional glass roof tiles, such that the array appears to be composed entirely of individual roof tiles (PV or non-PV roof tiles). Adjusting the density of PV elements on a roof surface changes both the appearance of the overall roof and the energy production of the solar array on the roof, typically measured in kilowatts (kW) or kilowatt-hours (kWh). Accordingly, the density of PV elements can be adjusted to achieve a desired kilowatt-hour production goal while maintaining an even distribution of the PV elements with a consistent visual aesthetic. In some aspects, PV elements can be distributed on the surface of a roof in a randomized, semi-randomized, or non-regular pattern to achieve the aesthetically pleasing neat, generally continuous, and elegant appearance.

Referring now to the drawing figures, in contrast with embodiments of the present disclosure, FIG. 1A shows an exemplary prior art PV array installed on roof 100. The exemplary PV array of FIG. 1A includes six solar panels 101 or modules which (though not shown in detail) are mounted on roof 100 using one of various known rail-based or rail-free mounting systems, as are currently employed by solar installers, such as Palo Alto, Calif.-based Tesla, Inc. (formerly SolarCity).

Figure 1B:
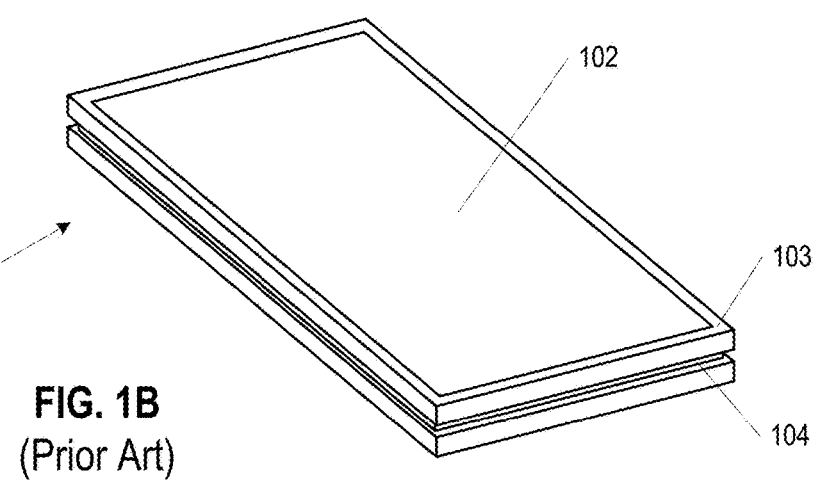
FIG. 1B shows an exemplary prior art photovoltaic module.

FIG. 1B shows one type of conventional solar panel 101 in more detail. Solar panel 101 includes PV laminate 102, which with conventional silicon-based cells, consists of a silicon sandwich of p-doped and n-doped silicon layers, a top glass sheet protecting the laminate, and a back sheet that can include a plurality of layers—and rigid metal frame 103, supporting PV laminate 102. Although shown as a unitary structure in FIG. 1B, laminate 102 may include a plurality of individual solar cells that are wired together to form a single unit under the top glass sheet. In the example shown in FIG. 1B, frame 103 is a grooved frame with groove 104 surrounding the outer face of frame 103 on all sides. Grooved frame modules such as module 101 are manufactured and sold by Tesla, Inc., of Palo Alto, Calif. In such a module, groove 104 serves as mechanism for attaching other mounting hardware (e.g., a leveling foot, an interlock) to join modules together and to support the modules over a roof surface. Those of ordinary skill in the art will appreciate that panel 101 may also have a plain, non-grooved frame. Non-grooved frames are typically interconnected to one another and connected to the roof using connectors that clamp down between the top and bottom edges of the frame.

Although these types of framed PV modules achieve their structural function, they are aesthetically suboptimal for some would-be customers and have material usage inefficiencies. First, conventional PV systems, such as that shown in FIG. 1A, are typically installed over an existing roof, and not as part of the existing roof, essentially requiring redundant structure since the PV array will shield most of the portion of the roof that it is installed over. Second, conventional systems are deemed by some people to be unappealing, having a choppy, discontinuous, and/or extraneous aesthetic. Conventional PV modules usually come in one of two colors: blue, signifying a poly-crystalline silicon structure, and black, signifying a mono-crystalline silicon or thin-film structure. Alternatively, thin-film solar materials are deposited in continuous sheets and are typically black. The metal frame portion can be painted black to help it blend in with the roof surface, or it can simply be raw aluminum in either case, the contrast between the look of the portion of the roof that is covered with solar panels and the remainder of the roof is generally quite dramatic. This contrast can be particularly jarring when a conventional PV array is mounted on a tile roof because the tile roof will differ not only in color and texture, but also in contour. As a result, roofs that are partially covered with solar panels that can be seen from very far distances due to the relative differences in reflectivity, elevation, height, and/or color between these two very different surfaces.

Hinged Multi-Section Solar Module Building Integrated Photovoltaic Arrays

As discussed herein, solar cells that are integrated as part of PV tiles, which in turn are connected to form PV modules, can be connected together as and laid down so that they make up the main surface of a roof, and in particular, a solar roof that has the appearance and aesthetic of a uniform tile roof. By having the PV tiles individually contain solar cells, forming part of the roof as components of the PV modules, advantages can be obtained in comparison to traditional "over-roof" arrays that are slightly elevated from the surface of a roof. For example, roof surfaces formed of PV modules that are directly built onto the framing structure of a roof can be lighter than over-roof installations, at least because the built-in BIPV solar array does not require a second structure above an existing roof. Further, a roof that is being replaced in a re-roofing installation can replace older or traditional roof tiles with PV modules (and optionally, some PV roof tiles) that may reduce the amount of materials needed for a re-roofing installation. Also, electrical connections, junction boxes, and wiring can be generally housed underneath PV roof tiles or PV modules of such BIPV assemblies, protecting such components from precipitation, wind, and excess heat, and further hiding such components from an observer so as to make the overall BIPV system visually attractive or uniform.

Designers of BIPV solar arrays generally aspire to provide for an advantage over traditional on-roof PV systems by having a less drastic topological difference, thereby reducing visually noticeable differences in height on regions of the roof. However, previous implementations of BIPV systems do not necessarily provide for further visual qualities or designs that effectively minimize noticeable differences between solar materials and standard roofing materials that form the overall PV system in the same manner as the presently disclosed system. In fact, they are typically quite different. Embodiments of the present disclosure provide for a BIPV system, with solar cells contained inside individual tile-like sections within a PV module and electrically connected in strings or other circuits, which is visually appealing at least in that the solar elements and roofing materials are combined and assembled in a layout that minimizes or camouflages the differences between the solar components and the standard construction materials.

Unlike other innovative approaches to forming multi-section PV modules, the structures disclosed herein mount PV tiles to a skeleton-like support structure, connecting along the top edge of the PV tiles. This support skeleton includes hinge structures that allow for direct securing of the support skeleton to a roof deck (e.g., without coupling to battens). Further, this support skeleton does not require traditional framing structures, thereby providing for a spacerless or frameless assembly. The support skeleton hinge structures also allow for tilting and lifting of PV tiles as part of a PV module once the PV module is secured to a roof deck, providing access to a region of (generally inaccessible) roof deck otherwise underneath the PV module. Moreover, the support skeleton form of PV modules uses much less material than traditional solar panels or even other tile-like PV modules, making the PV module of the present disclosure a particularly lightweight option, ideal for use on many types of roofs. Hinged multi-section PV modules that have three sections that approximate or are functionally similar to three separate PV tile areas. As part of a PV array, for example on a roof, rows and courses of such PV modules can look like rows of separate PV roof tiles, and indeed, such an aesthetic is desirable. For hinged multi-section PV modules considered herein having three PV sections, such PV modules can alternatively be referred to as "three-tile" modules, "series triple" modules, or the like.

A further part of the advantage of the present system is that the installation process implements much of the straightforward nature of laying a tile roof, but accounts for PV elements on flexible, multi-section modules (within individual PV sections) and making electrical connections between the solar cells on PV modules, and thus requires only minimal additional work and training. In addition to being faster to install than individual tile modules, having built-in flexibility between individual tile portions in an N-tile portion PV module allows for variations in roof planarity to be compensated for. A rigid PV module composed of N interconnected tile portions would propagate any such variations through the installation and result in a visually uneven installation. Such aspects of these multi-section modules can be understood in U.S. patent application Ser. No. 15/686,109 (co-owned by the Applicant and filed on Aug. 24, 2017), which is herein incorporated by reference.

A BIPV tile roof as considered herein is mounted in a manner that otherwise shares similar processes of assembly of a standard tile roof, for example: securing and sealing underlayment or other sheathing to frame elements of the roof, installing modules and/or tiles to form the main surface of the roof, working around obstacles (e.g., chimneys, skylights, vents, etc.) as needed, and installing ridge and edge tiles in combination with flashing or other trim structures of the roof. Each PV module further includes respective V+ and V− power outputs for connecting to other electrical component of a solar roof. Cell to cell connections are protected internally within the module. In the present system, the PV modules must have a structural integrity capable of accommodating and supporting PV elements within the tile-like sections, in terms of weight, heat generated, ability to connect electronics, and retaining strength to serve as a portion of a roof surface. The modules and tiles used can be of standard sizes as known in the industry. Further, modules and tiles used for systems considered herein can have a wide range of colors to match or blend with PV elements, including, but not limited to, blue, blacks, grays, browns, and natural clay colorations. It is understood that these same advantages can be applied to shingle roofs, with a corresponding PV module shaped to match shingles instead of tile.

FIG. 2A shows a schematic top perspective view of exemplary hinged multi-section PV module 200 having three PV tiles 202, and FIG. 2B shows a schematic exploded view of hinged multi-section PV module 200. Hinged multi-section PV module 200 is formed from PV tiles 202 mounted, adhered, or otherwise physically attached to support skeleton 204. Support skeleton 204, in essence, replaces the "pan" or "frame" often used by PV modules constructed to support PV tiles or analogous structures. Support skeleton 204 can be made of a polymer, and can be formed by various means, including but not limited to, injection molding, over-molding (onto the PV glasses), 3D printing, or machining. Specific polymers used to form support skeleton 204 can include (but are not limited to): polyphenyl ethers (PPE), polystyrenes (PS), polyethylenes (PE), poly(methyl methacrylates) (PMMA), acetyls, acetals, nylons, polycarbonates, or combinations thereof. Generally, polymer support skeleton 204 can be conditioned for outdoor use and environmental strains while also being appropriate for construction and solar collection applications. In other words, the conditioned or tempered polymer support skeleton 204 can have characteristics including heat resistance, rapid temperature variation resistance, UV stability, fire resistance, cold resistance, and the like. In some aspects, support skeleton 204 can be from one millimeter to ten millimeters (1-10 mm) thick, or at any gradient or increment of thickness within that range. In other aspects, support skeleton 204, or specific parts of support skeleton 204, can be about two millimeters (2 mm) thick.

Support skeleton 204 is formed to have projections and branching components that can extend in generally up-roof and down-roof directions from support spine 206. In some embodiments, spine 206 defines a longitudinal axis for support skeleton 204 from which hinge feet 208, hinge legs 210, midsection supports 212, tail end flange 214, and head end flange 216 extend laterally, generally perpendicular to the longitudinal axis of support skeleton 204. Spine 206 of support skeleton 204 is positioned underneath the overlap or lapped region of PV tiles 202. In combination, hinge feet 208 and hinge legs 210 provide for a hinge structure pivot point, where hinge feet 208 are anchored to an underlying roof deck, and where hinge legs 210 are coupled to the underside of a PV tile 202. As shown, each PV 202 can have two hinge legs 210 to support a respective PV tile 202, and each hinge leg 210 has a corresponding hinge foot 208 positioned on the opposite side of spine 206. Generally, when placing support skeleton 204 on a roof surface, hinge feet 208 extend in the up-roof direction and hinge legs 210 extend in the down-roof direction. The pivot point for each pairing of hinge foot 208 and hinge leg 210 can be located below spine 206 where hinge foot 208 and hinge leg 210 meet.

Midsection supports 212 extend from spine 206 on the same side as hinge legs 210. Midsection supports 212 (alternatively referred to as "gap region supports" or "arms") are positioned to be located at the interface or gap between two PV tiles 202 that are part of hinged multi-section PV module 200. Midsection supports 212 can provide for structural support for the side edges of PV tiles 202 (within the interior of the PV module), and can also protect against precipitation or other detritus from passing through gaps between the PV tiles 202 onto an underlying roof surface. Midsection supports 212 can extend from spine 206 a distance about equal to the height of PV tiles 202, or about equal to a height that reaches chamfered corners of PV tiles 202.

Flanges at either end of spine 206 provide for edging or side supports at the ends of hinged multi-section PV module 200, such that tail end flange 214 and head end flange 216 of support skeleton 204 can provide for structural support for the side edges of PV tiles 202 (on the exterior sides of the PV module), and can also protect against precipitation or other detritus from passing through gaps between the adjacent PV modules (or other roofing components) onto an underlying roof surface. In some aspects, tail end flange 214 can be longer than head end flange 216, to allow for coupling and avoidance of physical conflicts between adjacent PV modules or roof tiles. In other aspects, tail end flange 214 can extend about the same length from spine 206 as midsection supports 212. Additionally, electrical recesses 218 can be formed or molded into either or both of tail end flange 214 and head end flange 216, or proximate thereto within spine 206. Electrical recesses 218 can provide for space for solar array equipment to reside (e.g. wiring, cables, minor electrical boxes, junction boxes, micro-converters, micro-inverters, adaptors, etc.) Electrical connections can be routed through such electrical recesses 218 in skeleton structure 204, allowing for electricity generated by the solar cells in PV tiles 202 to be connected to a circuit of a BIPV array. In some aspects, each of spine 206, hinge feet 208, hinge legs 210, midsection supports 212, tail end flange 214, or head end flange 216 can be from one millimeter to ten millimeters (1-10 mm) thick, or at any gradient or increment of thickness within that range. In other aspects, each of spine 206, hinge feet 208, hinge legs 210, midsection supports 212, tail end flange 214, or head end flange 216 can be about two millimeters (2 mm) thick. In further aspects, tail end flange 214 can be arranged to be only partially covered by a PV tile 202, where the remaining surface of tail end flange 214 can provide support to a horizontally adjacent PV modules 200 in the BIPV array.

FIG. 2C shows a schematic bottom perspective view of hinged multi-section PV module 200 as shown in FIG. 2A. In FIG. 2C, the orientation and alignment between PV tiles 202 and projections of support skeleton 204 can be further understood. Spine 206 runs along the underside of the overlap region of PV tiles 202, with midsection supports 212 extending outward from spine 206 at the gaps between PV tiles 202. Further, for each PV tile 202, two (2) hinge foot 208 and hinge leg 210 pairings are positioned to structurally support their respective PV tile 202. Considered in combination, hinge foot 208 and hinge leg 210 can be referred to as flexure hinge 209. Hinge foot 208 rests on the roof underlayment, while hinge leg 210 is adhered or otherwise bonded to the underside of a respective PV tile 202. Along spine 206, in between each hinge foot 208 and hinge leg 210 pairing for an individual PV tile 202, are in-line braces 220 which help reinforce spine 206 and reduce the degree by which support skeleton 204 can bend or flex at those locations along spine 206. In other words, in-line braces 220 work to limit or prevent undesired bending of support skeleton 204 at locations aligned with the center of respective PV tiles 202. In-line braces 220 can also provide for additional support in bearing the weight of individuals walking on an installed array of PV modules 200.

Support skeleton 204 can have further structurally functional structures on its underside, specifically on the underside of midsection supports 212 and of hinge legs 210. Shown under the midsection supports 212 are flex limiters 222, flex limited being structures that limit the degree to which PV module 200 can bend at the gaps between PV tiles 202. In aspect where support skeleton 204 is made of a polymer and relatively thin, PV module 200 has some degree of flexibility at the gaps between the PV tiles 202. This flexibility can make installations easier because (1) it provides for some give & slack that can aid in installation/removal of the PV modules and (2) the PV modules can somewhat conform to an uneven or irregular contour of a roof in a manner rigid modules cannot. Flex limiters 222 function to prevent PV module 200 from bending too far (inward or downward, i.e., the bottom sides bending closer together), where each flex limiter 222 is formed of two downward extending projections. The projections of flex limited 222 are positioned opposite to each other with walls or sides that face each other; In other words, flex limiters 222 can be a single-piece brace with a symmetrical wedge cut out from the center of that brace. Flex limiters 222 can be arrayed down the center and along the length of midsection support 212, corresponding to the location of the gap above the midsection support 212. As PV module 200 flexes inward at gaps between PV tiles 202 (e.g., during installation or removal from a roof), the bending is stopped once the opposing sides of the two flex limiter 222 projected abut with each other. Flex limiters 222 can allow for a range of motion at these bending axes of from 1° to 20°, or at increments or gradients of degree within this range, which in specific aspects can be 5°.

The underside of hinge legs 210 can include stiffening ribs 224, which aid to transfer load from the PV glass held in cantilever to hinge feet 208. As shown, each hinge leg 210 has six (6) stiffening ribs 224 extending from the pivot point of each flexure hinge 209 along the nearly the full length of the respective hinge leg 210. In various other aspects, hinge leg can have one, two, three, four, five, seven, eight, nine, ten, or more than ten stiffening ribs 224. The width of stiffening ribs 224 can be proportional as appropriate to the width of hinge leg 210 and the number of stiffening ribs 224 on the underside of hinge leg 210. In some aspects, the distance stiffening ribs 224 can extend along of the length of hinge leg 210 can be from 25% of the length of hinge leg 210 to 95% of the length of hinge leg 210, or any increment or gradient of length within that range.

In some embodiments, PV tiles 202 can be considered and referred to as PV glass, being primarily formed of glass holding solar cells, with a black backsheet to mimic the appearance of a roofing tile, but not being made from the same material as a traditional roofing tile. In various aspects, each PV glass can be a textured or a smooth glass. Further, the gaps between each PV tile 202 and/or PV glass of PV module 200 can be relatively small, from about three to four millimeters (3 mm-4 mm) wide. The presence of gaps between each of the three PV tiles 302 as shown lends each PV 300 an appearance of three discrete shingles or tiles.

PV modules 200 can have a shape that is generally rectangular, optionally having rounded corners, sharp corners, smooth edges, notches along the edges, in various combinations, and the like. The edges of PV modules 200 can further be beveled, chamfered, rounded, right-angled, or the like. PV modules 200 can be oriented either with a longer edge generally parallel to the width dimension an underlying roof surface. Generally, PV modules 200 considered herein are substantially planar in geometry, but can accommodate a degree of flexing and unevenness of a roof. In other PV tiles 202 can be configured to mimic shapes that include, but are not limited to: curved tiles, barrel tiles, s-shaped tiles, Spanish tiles, tiles shaped to be used on the edges of a roof, or tiles shaped to interlock with adjacent tiles.

It should be understood that, in alternative embodiment, non-PV modules can also be constructed using a support skeleton similar to or as disclosed herein. On such support skeletons, traditional or standard roofing tiles or slates can be mounted, such that a complete roof can be formed with both PV and non-PV regions as appropriate, while maintaining a consistent aesthetic. Further, a roof formed of both PV and non-PV modules based on such support skeletons can further reduce the number of battens needed for an underlying roof support structure. Moreover, a roof formed of both PV and non-PV modules based on such support skeletons, can be more efficient to install at least because these modules share the same general module format, and do not require more than one type of module to be installed to form a complete roof with a BIPV system.

Figures 3A, 3B:
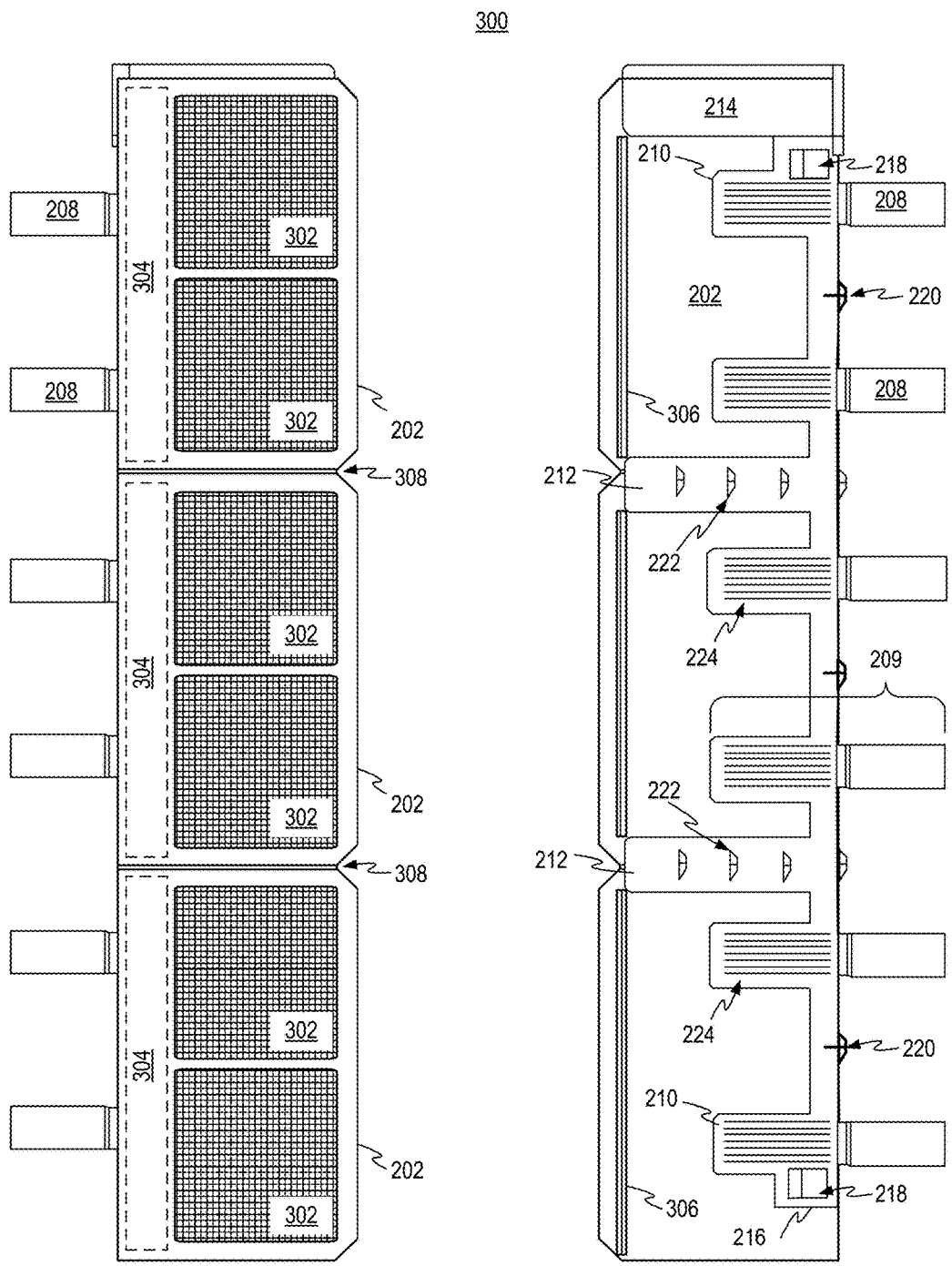
FIG. 3A shows a top surface plan of an exemplary hinged multi-section photovoltaic module, having three PV tiles, in accordance with aspects of the disclosure.
FIG. 3B shows a bottom surface plan view of the hinged multi-section photovoltaic module, as shown in FIG. 3A, in accordance with aspects of the disclosure.

FIG. 3A shows a top surface plan view of exemplary hinged multi-section PV module 300, having three PV tiles 202. FIG. 3B shows a bottom surface plan view of hinged multi-section PV module 300, as shown in FIG. 3A. FIG. 3A further illustrates each PV tile 202 having two (2) solar cells 302 on the upper surface in the reveal portion of PV tiles 202. Overlap region 304 for each PV tile 202 is indicated in dashed line, to illustrate the relative area of each PV module 300 that is covered by an adjacent up-roof course of modules, tiles, or other roofing components, when PV module 300 is part of an installed BIPV system. On the underside of PV module 300 are sealant ridges 306 which can be positioned to align with, rest upon, and seal onto overlap regions 304 of adjacent down-roof PV modules 300. Successive vertical courses of PV modules 300 can be sealed to each other with sealant ridges 306 to be water-tight, preventing precipitation or other detritus from slipping in underneath the bottom edge of PV tiles 202 to the underlying roof surface. Sealant ridges 306 can also prevent wind from getting underneath PV modules 300 and exerting uplift forces that might damage an individual PV module 300 or a BIPV array. In various aspects, sealant ridges 306 are generally heat-tolerant, and can be formed of rubber, silicone, polymers, or the like. Between PV tiles 202 of PV module 300, at the lower (down-roof) edge of adjacent PV tiles 202 are notches 308 where the gap between adjacent PV tiles 202 widens, presenting handling points for PV tiles 202 and PV modules 300 as a whole, and also presenting a consistent aesthetic for PV tiles 202 on different PV modules 300 as part of the same BIPV array or system.

In many embodiments, each PV tile 202 can have two flexure hinges 209 supporting the PV tile 202. In alternative embodiments, one hinge or three hinges may support any given PV tile 202. Also, for individual PV tiles or non-PV tiles used to fill gaps in a course or end the course at the edge of a roof, single hinges can be used to support those individual tiles. Such individual tiles can be one (1) PV glass in width or half (½) a PV tile in width.

As shown, underneath the gaps between PV tiles 202 of PV module 300 are midsection supports 212, where each midsection support 212 has four (4) flex limiters 222 equally spaced relative to each other on the underside of midsection support 212. In other aspects, any given midsection support 212 can have one, two, three, five, six, or more than six flex limiters 222 running along the length of midsection support 212. In further aspects, flex limiters 222 can be asymmetrically placed along the length of midsection support 212, or unequally spaced relative to each other (e.g., grouped, biased toward the up-roof edge, biased toward the down-roof edge, etc.) along the length of midsection support 212.

In some aspects, solar cells 302 in the reveal portion of PV tiles 202 can be an array of photovoltaic laminate regions distributed in a row along the solar-facing side of PV module 300. In other aspects, solar cells 302 and associated electrical connectors (e.g., bus bars) can formed from silicon layers embedded between transparent polymer layers such as thermoplastic polyolefin (TPO), and further sandwiched between front and backing solar glass plates. The photovoltaic laminate regions can be covered by protective cover that can protect photovoltaic laminate regions from damage, obscure photovoltaic laminate regions from view without substantially reducing the amount of solar energy received by photovoltaic laminate regions, and create a more uniform cosmetic appearance for solar roofing module 100. In some embodiments, protective covers can take the form of hardened glass having a geometry meant to mimic the shape of traditional roofing shingles.

Figure 4A:
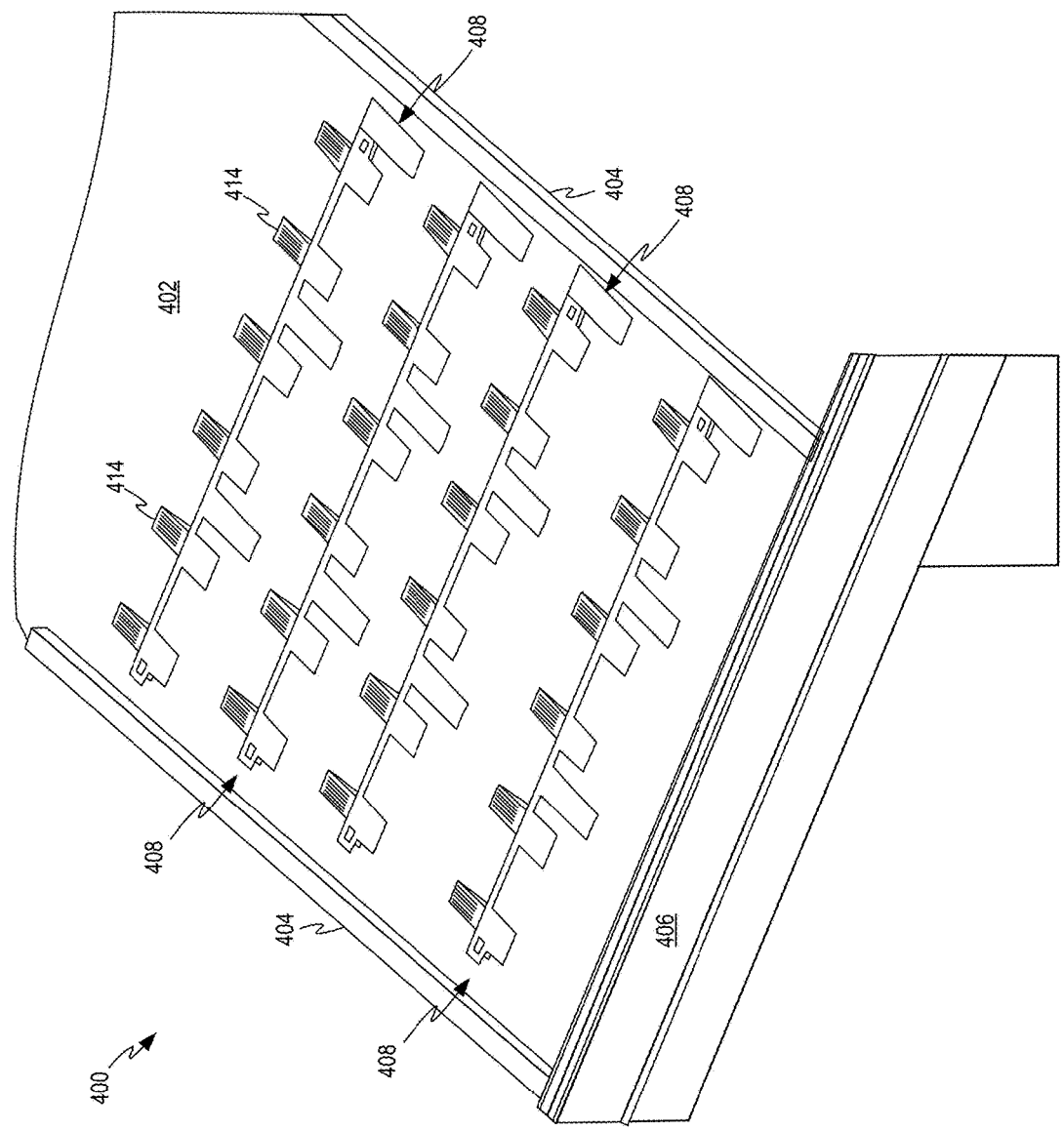
FIG. 4A shows a schematic of an exemplary building integrated photovoltaic system having hinged multi-section PV modules, illustrated without PV tiles, in accordance with aspects of the disclosure.
Figure 4B:
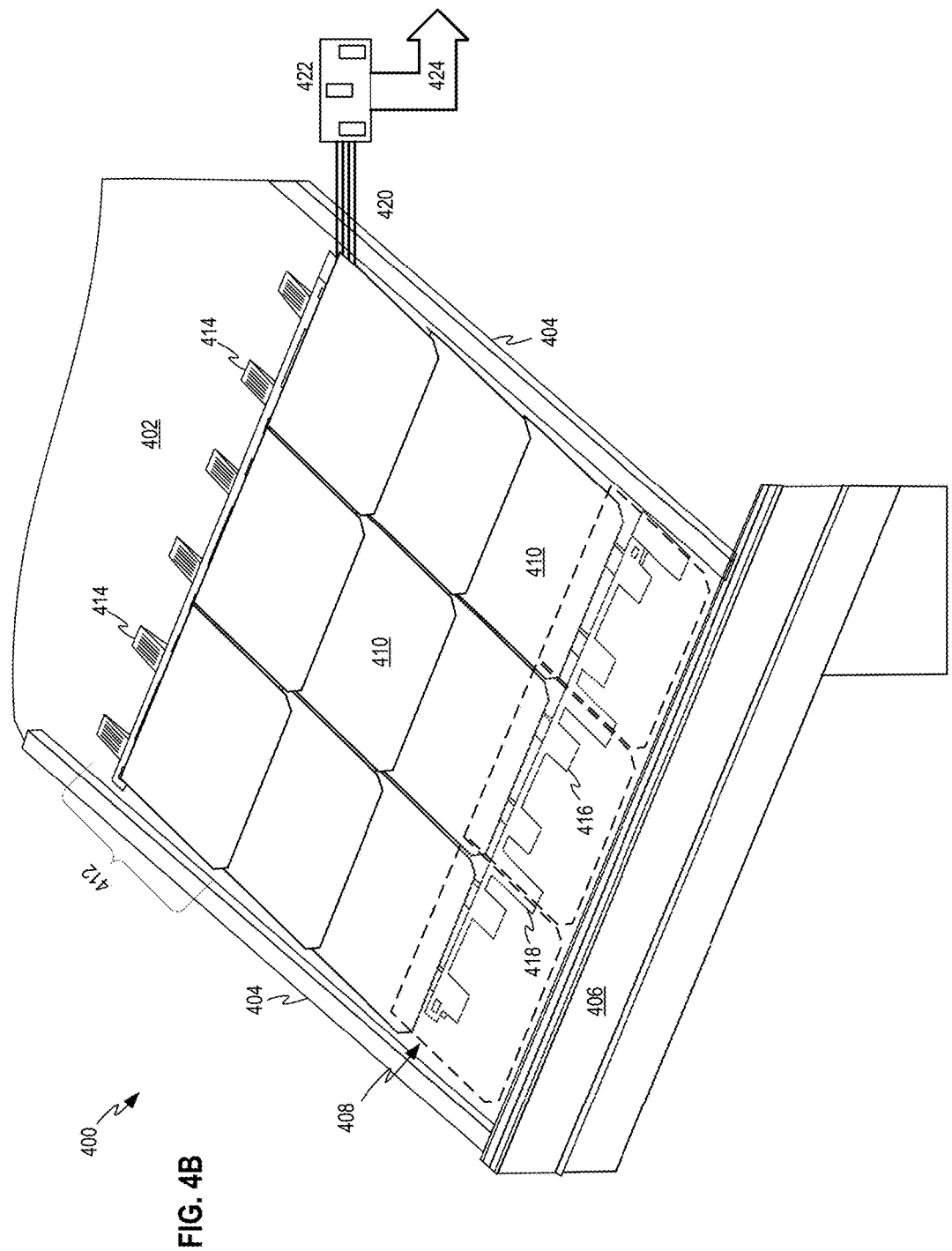
FIG. 4B shows a schematic of an exemplary building integrated photovoltaic system having hinged multi-section PV modules, in accordance with aspects of the disclosure.

FIG. 4A shows a schematic of exemplary BIPV system 400 having hinged multi-section PV modules, illustrated without PV tiles. FIG. 4B shows a schematic of the same exemplary BIPV system 400 having hinged multi-section PV modules 412, illustrated with PV tiles 410. BIPV system 400 is formed by mounting PV modules 412 on roof deck 402, where roof deck 402 can be an underlayment layer of a roof. Unlike traditional roof structures, roof deck 402 does not have battens laid horizontally across, from side to side, of roof deck 402. Instead, PV modules 412 are affixed directly onto roof deck 402. The structure supporting roof deck 402 is shown including cross-battens 404 (in this case, alternatively referred to as vertical battens, rising along with the slope of the underlying roof, as there are no horizontal battens to "cross" against) and eave flashing 406. The overall roof can further include ridge structures, edge flashing, vents, and the like. FIG. 4A particularly shows the arrangement and positioning of support skeletons 408 for respective PV modules 412 on roof deck 402, where support skeletons 408 are secured to roof deck 402 at hinge feet 414 of each support skeleton 408.

FIG. 4B shows four courses of PV modules 412 set on roof deck 402. Each course of PV modules 412 is slightly overlapped by a successive up-roof course of PV modules 412. Each PV tile 410 has a reveal portion (in which solar cells are located) and a lapped portion, where support skeleton 408 is positioned underneath the lapped section of PV tile 410. As illustrated, the bottom course PV module 412 is should with transparent PV tiles in order to show the position of two hinge legs 416 supporting each PV tile 410 and midsection supports 418 underneath the gaps between each PV tile 410. It should be understood that the section of BIPV system 400 shown in FIG. 4B is electrically connected to a circuit as part of the underlying structure, which can include batteries, various loads within the structure, and can further be connected to an electrical grid.

BIPV system 400 can further include other roofing elements, such as standard (traditional, non-PV) roof tiles or individual PV roof tiles, which can be used to fill gaps between PV modules 412, to finish off ends of rows or courses of PV elements close to the edge of the roof, or to otherwise accommodate and connect portions of a PV array on the roof surface where PV modules 412 do not fit or would not be ideal for BIPV system 400. Non-PV tile elements can also be used to cover spaces between PV elements of the roof surface and flashing or trim components of roof surface, or for sections of roof surface where the tile needs to be cut to accommodate other roof structures (e.g., vents, chimneys, etc.). In combination, these elements form the roof envelope for BIPV system 400.

FIG. 4B further shows schematically electrical bus 420 connecting to minor electrical box 422, which can be a junction box, an AC/DC converter or inverters, another form of electrical adaptor, or the like. Minor electrical box 422 can further connect via connection 424 to the local circuit of the building on which the roof is mounted. By extension, connection can connect minor electrical box and BIPV 400 to a local electrical grid.

The combination of these elements above for BIPV system 400, primarily using PV modules 412, can provide for an overall roof appearance that is visually pleasing, with minimal points of contrast or sharp edges to distract the eye of an observer. The clear aesthetic advantage includes the fact that the roof surface does not look choppy or discontinuous, and instead has a consistent visual appearance.

Figure 5:
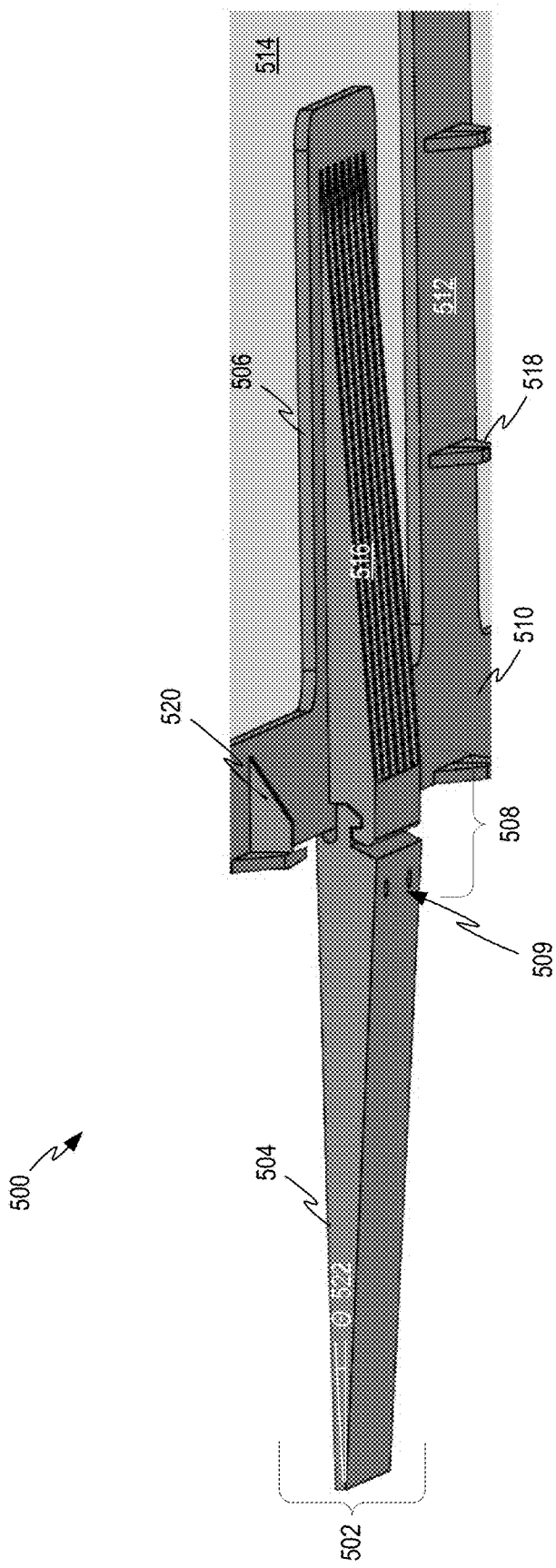
FIG. 5 illustrates a foot and leg of a hinged multi-section photovoltaic module, in accordance with aspects of the disclosure.

FIG. 5 illustrates hinged multi-section photovoltaic module 500 having hinge foot 504 and hinge leg 506 as part of flexure hinge 502. Flexure hinge 502, and particularly locking region 508, is shown in a locked or coupled configuration. Flexure hinge 502 is positioned along support spine 510, proximate to midsection support 512. Both midsection support 512 and hinge leg 506 are underneath and supporting the underside of PV glass 514. As in other embodiments, support spine 510 has in-line braces 520, hinge leg 506 has ribs 516, and midsection support 512 has flex limiters 518, each contributing to the structural strength and range of motion of flexure hinge 502 individually and PV module 500 as a whole. In some aspects as shown, hinge foot 504 has a generally triangular shape, where the length of hinge foot 504 can be relatively long such that the load of PV glass 514 supported by the support skeleton at flexure hinge 502 is distributed across a desired area of underlying roof deck. Accordingly, distal angle 522 ($\Theta$) of hinge foot 504, the angle of the section further from support spine 506, can be set to determine the rise and length of the triangle that forms hinge foot 504. In some aspects distal angle 522 can be from about 1° to about 15° ($1° \leq \Theta \leq 15°$), or at an angle within that range. Conversely, hinge leg 506 and ribs 516 can form a shape that is complementary to the triangle formed by hinge foot 504 (generally triangular but oriented with the length of the structure is in contact with PV glass), with an equal or proportional length in comparison to hinge foot 504.

Hinge foot 504 is shown with screw holes, and via screws passing through screw holes 509, hinge foot 504 is secured to the base of a roof deck (usually with an underlayment present). The location of the screws is provided as close to the junction or pivot of flexure hinge 502 as possible, in order to maximize the screw pull-out strength (or resilience), which can be determined by a summing of moments across flexure hinge 502. Forces acting on a PV module can include wind uplift, which typically will act at a location about ⅔ up the length of PV glass, 514 in the middle of the reveal. Screws are not able to be positioned at that location (nor should screws be located in such a location passing through the PV glass), accordingly hinge foot 504 is formed to be relatively long, extending to have a "long tail" so as to provide for more leverage on the roof. The long tail of hinge foot 504 will primarily receive compressive force when wind is pulling upward on PV glass 514; in other words, as wind lifts up on the underside of PV glass 514, force is conveyed through the locked flexure hinge, and is applied as a force directed downward onto the underlying roof through secured hinge foot 504. There is no significant expected tension forces acting on hinge foot 504 when set as part of an installation, in part because any force pulling upward on hinge foot away from the underlying roof are mitigated by the pull-out strength of the screws and by any additional support of the cantilevered PV glass 514 that may be provided by sealant materials connecting PV glass 514 to a down-roof structure. The longer the tail of hinge foot 504, the more upward force can be withstood, because the sum of moments is directed further out to the end of the long tail. As shown in FIG. 5, hinge foot 504 and hinge leg 506 are about equal (1×) in length. However, in various embodiments, hinge foot 504 can be twice (2×), three times (3×), or four times (4×) the length of hinge leg 506. In other words, hinge leg 506 can be 25%, 33%, 50%, or 100% of the length of hinge foot 504, or at any increment or gradient of ratio length within such ranges.

Figure 6A:
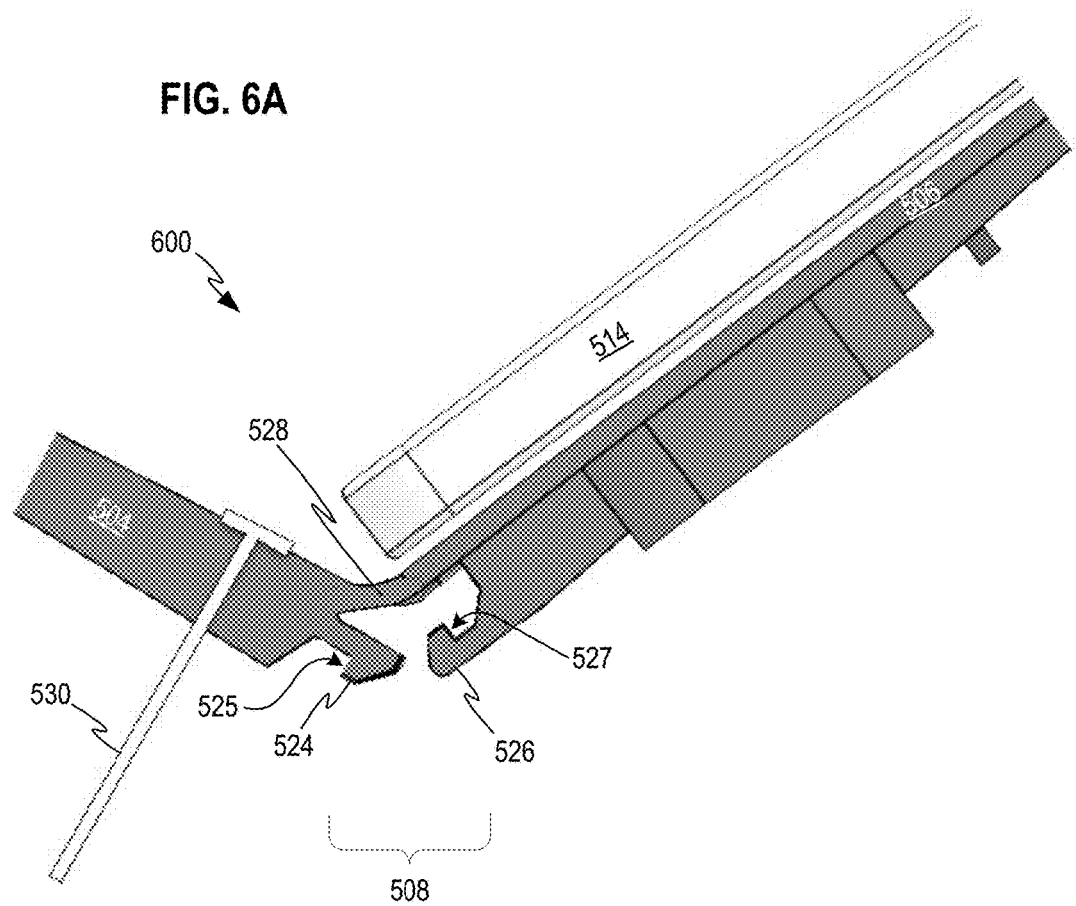
FIG. 6A illustrates a hinged multi-section photovoltaic module with the hinge in an open configuration, in accordance with aspects of the disclosure.
Figure 6B:
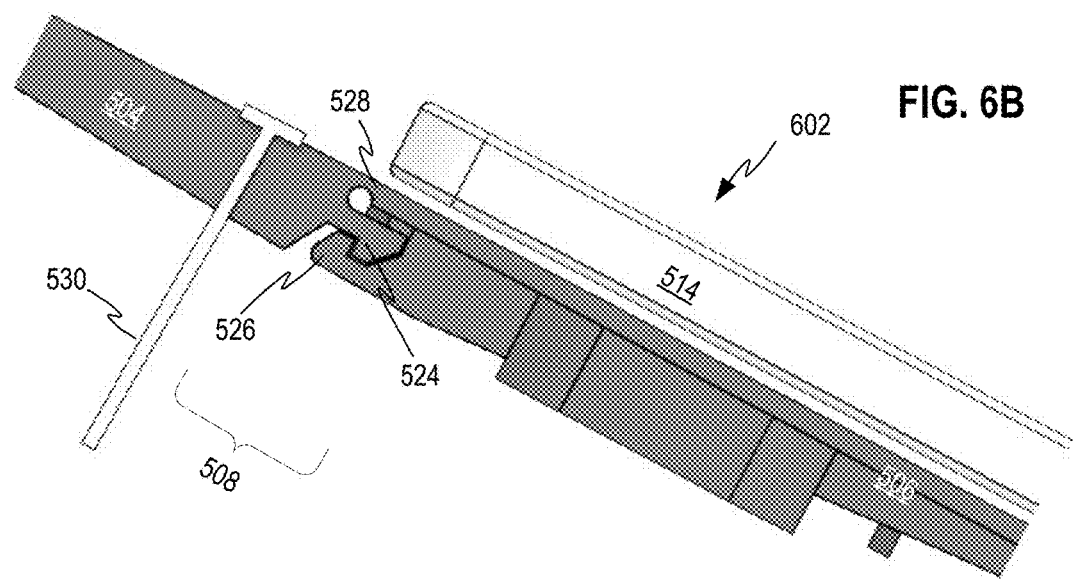
FIG. 6B illustrates a hinged multi-section photovoltaic module with the hinge in an coupled configuration, in accordance with aspects of the disclosure.

FIG. 6A illustrates hinged multi-section photovoltaic module with flexure hinge 502 in an open configuration 600, while FIG. 6B illustrates a hinged multi-section photovoltaic module with flexure hinge 502 in a coupled configuration 602. Within locking region 508 is first detent 524, extending into locking region 508 as a projection from hinge foot 504, and being oriented to face downward (toward the roof deck) when installed on a roof. Also within locking region 508 is second detent 526, extending into locking region 508 as a projection from hinge leg 506, and being oriented to face upward (away from the roof deck) when installed on a roof. First detent 524 has first contact surface 525 and second detent 526 has second contact surface 527, where in coupled configuration 602, first contact surface 525 and second contact surface 527 are in direct contact with each other, forming a frictional interface, holding hinge foot 504 and hinge leg 506 in place relative to each other. In many embodiments, the resisting moment of the joint formed by flexure hinge 502 needs to be about thirty foot-pounds (30 ft·lbs). In some aspects as shown, the purchase of both first detent 524 and second detent 526 (alternatively referred to as "hooks" or "teeth") forming locking region 508 are relatively sharp and pronounced, such that about one hundred pound-foot (100 lb·ft) of torque is required to decouple first detent 524 and second detent 526 from each other. In other aspects, the force required to decouple first detent 524 and second detent 526 from each other can be about forty pound-foot (40 lb·ft) of torque, thus providing for a relatively less violent coupling or uncoupling motion. In further aspects, the purchase of both first detent 524 and second detent 526 can be partially rounded (not shown), providing for greater ease in disengaging and re-engaging flexure hinge 502 for maintenance activities.

It should appreciated that flexure hinge 502 can be formed as one piece, connected by bridge 528 on the top side of flexure hinge 502, positioned above first detent 524 and second detent 526. Accordingly, flexure hinge 502 can also be referred to as a "living hinge". Flexure hinge 502, and bridge 528 in particular, can be constructed to have an operational lifetime with appropriate resilience for an expected number of cyclical, physical bending strains. In some aspects, bridge 528 can maintain its structural integrity for up to twenty cycles of 5° bends. In some aspects, bridge 528, and by extension flexure hinge 502, can have a range of motion allowing for bending up (from a 0° flat, coupled configuration) to about 5°, 10°, 12.5°, 15°, or 20°. In other aspects, extension flexure hinge 502 can have a range of motion allowing for bending up to about 45°, or any increment or gradient or range therein. In further aspects, flexure hinge 502 can have a range of motion allowing for bending up to about 90°, positioning hinge leg 506 to a position perpendicular to hinge foot 504. In yet further aspects, flexure hinge 502 can have a range of motion allowing for bending up to about 180°, completely inverting hinge leg 506 to a position directly over hinge foot 504.

Screw 530 can be used to secure hinge foot 504 to an underlying roof deck. One or more screws 530 passing through screw holes 509 can be used to secure hinge foot 504, further aiding in the distribution of the load of PV glasses 514 being held in cantilever by flexure hinge 502.

Figure 7:
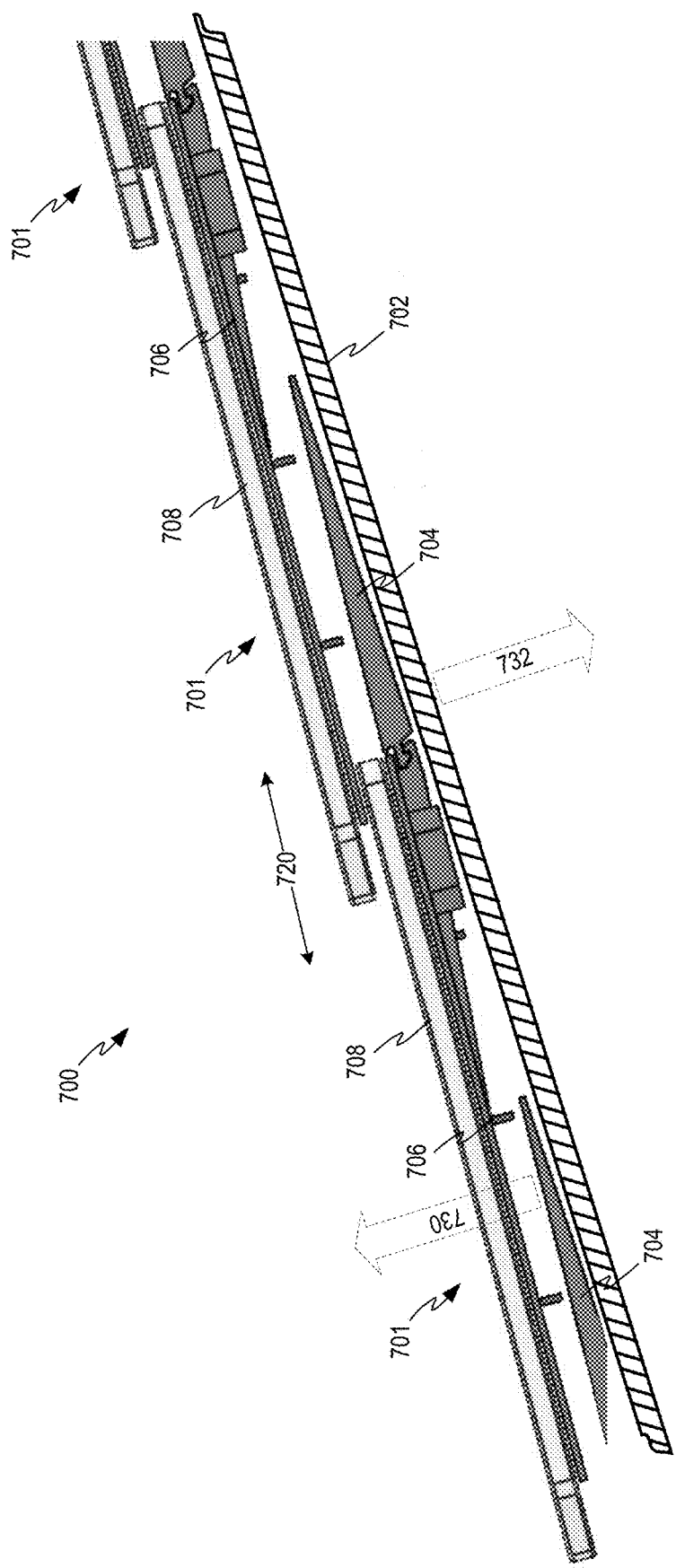
FIG. 7 shows a cross-sectional illustration of hinged multi-section photovoltaic modules mounted to a roof surface, in accordance with aspects of the disclosure.

FIG. 7 shows a cross-sectional illustration of hinged multi-section PV modules 701 mounted to roof surface 702, forming a section of BIPV array 700. In many aspects, roof surface 702 is a roof deck having an underlayment attached thereto. Hinge feet 704 extend in an up-roof direction from the lapped region of PV modules 701, and are in contact with and secured to roof surface 702. Hinge legs 706 extend in a down-roof direction from the lapped region of PV modules 701, and are adhered or otherwise bonded to PV glasses 708, supporting them in in cantilever. In some aspects as shown, between successive vertical courses of PV modules 701, the end of a hinge leg 706 can be sealed to the top of the lapped region of an adjacent down-roof PV glass 708.

Unlike arrangements of successive vertical courses of other types of PV modules, BIPV array 700 does not have limitations or covering of the reveal portions of PV glasses 708 due to attachment hardware or configurations. Further, the present BIPV array 700 does not have load interactions between successive vertical courses of PV modules 701 in that the load of hinge leg 706 and PV glass 708 held in cantilever is not transmitted onto a down-roof course PV module 701. Rather, successive vertical courses of PV modules 701 are only physically connected with a sealant material which is not configured to transmit load, but rather functions to prevent moisture or other material from getting in between the successive vertical courses of PV modules 701.

In some aspects, the region or amount of overlap between successive vertical course of PV modules 701 is variable, or adjustable. Adjustable overlap region 720 indicates a range where the reveal portion of an up-roof PV glass 708 can be moved over the lapped portion of an adjacent down-roof PV glass 708. The adjustability of where each course of PV modules can lie along the slop of a roof provides for flexibility in installing BIPV array 700.

Further illustrated are the directions of load that can be exerted on PV modules 701. In some implementation a uplift force 730 (typically from wind) pushes a PV glass 708 upward. This creates a compressive load 732, as the uplift force 730 on the down-roof end of PV glass 708 transfers across the pivot point of PV module 701 in contact with the underlying roof surface 702, and that compressive force 732 is driving into the roof surface 702 through hinge foot 704.

Figure 8:
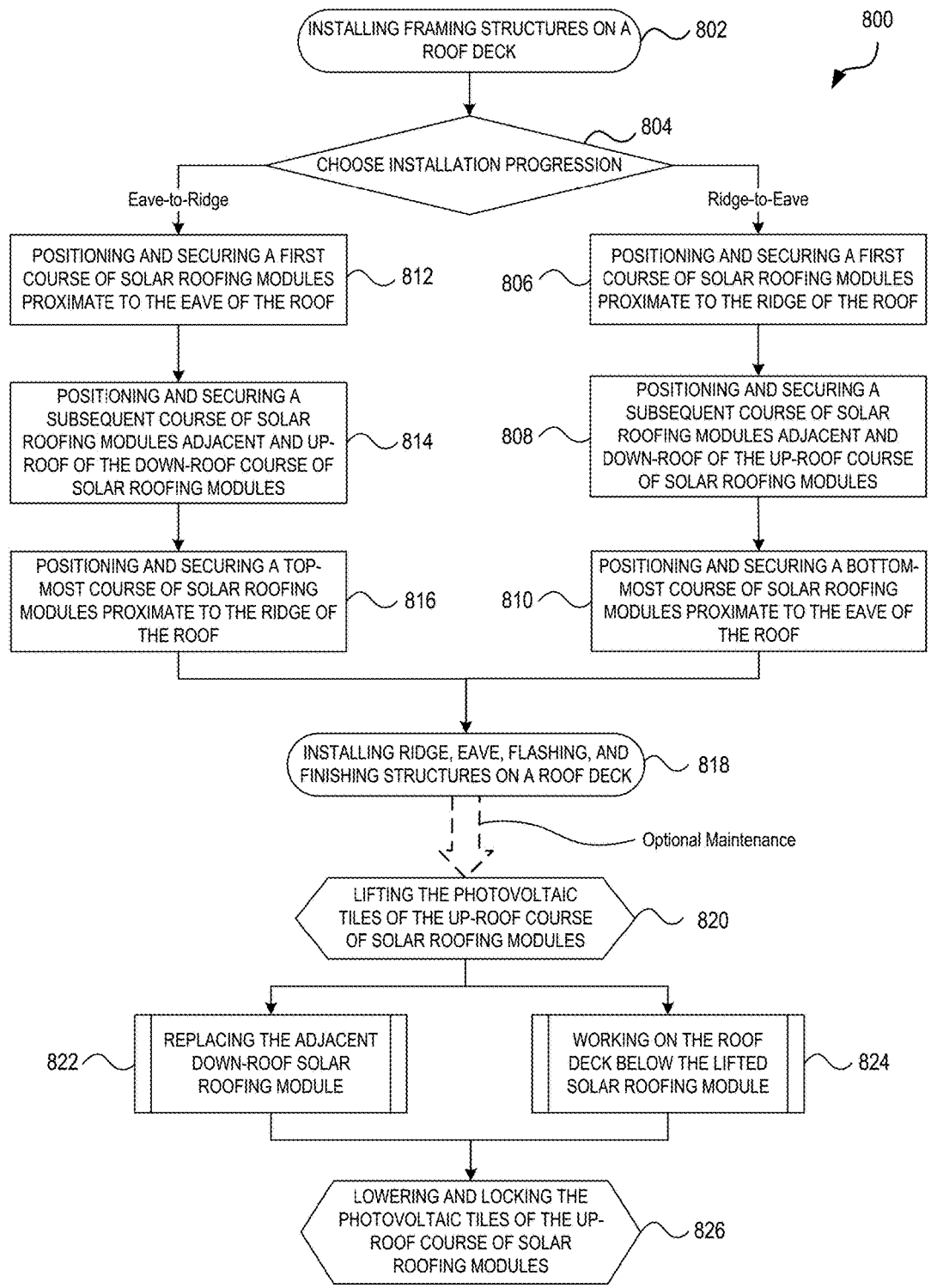
FIG. 8 is a flowchart illustrating an exemplary process of assembling and installing a building integrated photovoltaic system, in accordance with aspects of the disclosure.

FIG. 8 shows flowchart 800 illustrating an exemplary process of assembling and installing a BIPV system, and an exemplary process for conducting repairs on that BIPV system. As noted above, PV modules of the present disclosure, due to their hinge structure, can partially tilt upward, providing for temporary access to the region of a roof deck that would be otherwise covered by that PV module once installed. By allowing for the PV tiles of an up-roof PV module to be lifted, a down-roof PV module can be easily replaced, with unobstructed access for securing the hinge foot of the down-roof PV module to the roof deck.

In some embodiments, assembly of a BIPV system as disclosed herein starts at block 802, the installing of framing structures on a roof deck. Framing structures can include vertical battens that track the rise and slope of the roof, rafters, buttresses, or other such structures. In such embodiments, battens typically used to form a roofing lattice are not necessary, as the PV modules do not have a need to couple to battens, but rather are directly secured to the roof deck. At decision block 804, the choice can be made to assemble a BIPV system in a (standard) eave-to-ridge progression or in a ridge-to-eave progression. Proceeding in accordance with the roof-to-eave direction of installation of the BIPV system, block 806 includes positioning and securing a first course of solar roofing modules proximate to the ridge of the roof, which can be by screwing hinge feet of the solar roofing modules into the roof deck. Advantageously, installing the PV modules in the ridge-to-eave direction allows for installation where the installer is not forced to stand, step, sit, kneel, or otherwise put weight on a down-roof course of PV elements (potentially damaging those PV elements) as the next up-roof course is installed. For the first course of PV modules next to the ridge of the roof, there is no further relatively up-roof course of solar modules. Block 808 includes positioning and securing a subsequent course of solar roofing modules adjacent and down-roof of the up-roof course of solar roofing modules. The subsequent course of solar roofing modules can be installed by screwing hinge feet of the solar roofing modules into the roof deck, which can be done optionally with the PV tiles of the immediately up-roof solar roofing module lifted out of the way. Further, the support skeleton of the solar roofing module being installed can be placed relative to the immediately up-roof PV within a range of variance along the slope of the roof such that the solar roofing module being installed can have an adjustable amount of reveal, as appropriate for exposure of solar cells in the solar roofing module being installed, and/or to fit within the structural limitations and area of the overall roof. Block 810 includes positioning and securing a bottom-most course of solar roofing modules proximate to the eave of the roof. Block 818 includes installing ridge, eave, flashing, and finishing structures on a roof deck.

Alternatively from decision block 804, proceeding in accordance with the eave-to-roof direction of installation of the BIPV system, block 812 includes positioning and securing a first course of solar roofing modules proximate to the eave of the roof. Block 814 includes positioning and securing a subsequent course of solar roofing modules adjacent and up-roof of the down-roof course of solar roofing modules. Block 816 includes positioning and securing a top-most course of solar roofing modules proximate to the ridge of the roof. Again, block 818 includes installing ridge, eave, flashing, and finishing structures on a roof deck.

In other embodiments, disassembly of a BIPV system can follow an analogous process, where an up-roof solar roofing module can be partially lifted up such that the securing hardware of the relatively down-roof solar roofing module can be removed efficiently.

In further embodiments, optional maintenance of a BIPV system can follow an analogous process, where an up-roof solar roofing module can be partially lifted up such that work can be done on features below the solar roofing module that are otherwise inaccessible. Block 820 includes lifting the photovoltaic tiles of the up-roof course of solar roofing modules. In one aspect, following lifting of the PV tiles, block 822 includes replacing the adjacent down-roof solar roofing module. In another aspect, following the lifting of the PV tiles, block 824 includes working on the roof deck below the lifted solar roofing module, conducting any repairs, re-wiring, or other such work as needed at that section of the roof. Block 826 includes lowering and locking the PV tiles of the up-roof solar roofing module into place, such that the living hinge is in a coupled configuration.

It should be understood that in these embodiments, roof pitches where such systems are installed are generally non-zero, and that the systems are installed to account for the angle or slope of (non-flat) roofs. The distances or gaps between various tiles, rows, courses, or assemblies thereof, and the degree to which such gaps are concealed will be dependent on roof pitch, the roof dimensions, the distance a viewer is from the roof, and the height of the viewer.

In further alternative embodiments, PV modules as discussed herein may be inductively coupled with an underlying power mat(s) or lattice. Such an induction-based system would eliminate the need for most wiring and physical connectors. The underlying power mat(s) or lattice would be disposed on a roof deck or battens of a roof structure, and electrically coupled with minor electrical boxes or optimizers that further connect with an electrical main box. PV tiles would be arranged and secured over corresponding sections of the power mat(s) or lattice, such that the underlying power mat(s) or lattice would receive electricity collected by solar cells through induction, and subsequently convey that electricity to the minor electrical boxes and/or electrical main box.

From the foregoing, it will be appreciated that specific embodiments of the disclosure have been described herein for purposes of illustration, but that various modifications may be made without deviating from the spirit and scope of the various embodiments of the disclosure. Further, while various advantages associated with certain embodiments of the disclosure have been described above in the context of those embodiments, other embodiments may also exhibit such advantages, and not all embodiments need necessarily exhibit such advantages to fall within the scope of the disclosure. Details of the system may vary considerably in its specific implementation, while still being encompassed by the present disclosure. Accordingly, the disclosure is not limited, except as by the appended claims.

References throughout the foregoing description to features, advantages, or similar language do not imply that all of the features and advantages that may be realized with the present technology should be or are in any single embodiment of the disclosure. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment. Further, any specific numbers noted herein are only examples; alternative implementations may employ differing values or ranges, and can accommodate various increments and gradients of values within and at the boundaries of such ranges. Accordingly, the actual scope of the disclosure encompasses not only the disclosed examples, but also all equivalent ways of practicing or implementing the disclosure under the claims.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further implementations of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in textual context of this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Although certain aspects of the disclosure are presented below in certain claim forms, the applicant contemplates the various aspects of the disclosure in any number of claim forms. Accordingly, the applicant reserves the right to pursue additional claims after filing this application to pursue such additional claim forms, in either this application or in a continuing application.

The invention claimed is:

1. A hinged photovoltaic (PV) module comprising:
   three PV tiles, each PV tile having at least one solar cell, bonded to two flexure hinges;
   a support skeleton, comprising:
      a spine structure defining a longitudinal axis;
      a plurality of midsection supports, extending from the spine, configured to extend under gaps between the three PV tiles; and
      the two flexure hinges extending from the spine, each flexure hinge having a hinge foot configured to secure to a roof deck and a hinge leg configured to bond to one of the PV tiles.

2. The hinged PV module of claim 1, wherein the support skeleton is formed of a polymer, the polymer being a polyphenyl ether, a polystyrene, a polyethylene, a poly (methyl methacrylate), an acetyl, an acetal, a nylon, a polycarbonate, or a combination thereof.

3. The hinged PV module of claim 1, wherein each section of the support skeleton is about two millimeters (2 mm) thick.

4. The hinged PV module of claim 1, wherein the spine further comprises an inline-brace positioned between adjacent PV tiles.

5. The hinged PV module of claim 1, wherein the hinge leg and hinge foot of each flexure hinge are connected by a bridge structure.

6. The hinged PV module of claim 1, wherein each hinge leg further comprises stiffening ribs that extend along of the length of the hinge leg, wherein the stiffening ribs are from about 25% to about 95% of the length of the hinge leg.

7. The hinged PV module of claim 1, wherein for each flexure hinge, the hinge leg is from about 25% to about 100% of the length of the hinge foot.

8. The hinged PV module of claim 1, wherein each flexure hinge has a range of motion allowing for bending up to 90° from a flat configuration.

9. The hinged PV module of claim 1, wherein for each flexure hinge, the hinge foot is about twice, about three times, about four times, or about equal to the length of the hinge leg.

10. The hinged PV module of claim 1, wherein each PV tile further comprises a sealant material on the underside of the PV tile, arranged to be in between the midsection supports.

11. The hinged PV module of claim 1, wherein the PV tiles are configured to be held in cantilever by the flexure hinges.

12. The hinged PV module of claim 1, wherein the support skeleton has a tail end flange that is configured to partially support a further photovoltaic structure horizontally adjacent to the PV module.

13. A hinged photovoltaic (PV) module comprising:
two or more PV tiles, each PV tile having at least one solar cell;
a support skeleton, comprising:
a spine structure defining a longitudinal axis;
a plurality of midsection supports, extending from the spine, configured to extend under gaps between the two or more PV tiles; and
one or more flexure hinges extending from the spine, each flexure hinge having a hinge foot configured to secure to a roof deck and a hinge leg configured to bond to one of the PV tiles, wherein the hinge leg further comprises stiffening ribs that extend along of the length of the hinge leg, wherein the stiffening ribs are from about 25% to about 95% of the length of the hinge leg.

14. The hinged PV module of claim 13, wherein the support skeleton is formed of a polymer, the polymer being a polyphenyl ether, a polystyrene, a polyethylene, a poly (methyl methacrylate), an acetyl, an acetal, a nylon, a polycarbonate, or a combination thereof.

15. The hinged PV module of claim 13, wherein each section of the support skeleton is about two millimeters (2 mm) thick.

16. The hinged PV module of claim 13, comprising three PV tiles, wherein each PV tile is bonded to two flexure hinges.

17. The hinged PV module of claim 13, wherein the spine further comprises an inline-brace positioned between adjacent PV tiles.

18. The hinged PV module of claim 13, wherein the hinge leg and hinge foot of the flexure hinge are connected by a bridge structure.

19. The hinged PV module of claim 13, wherein the hinge leg is from about 25% to about 100% of the length of the hinge foot.

20. The hinged PV module of claim 13, wherein the flexure hinge has a range of motion allowing for bending up to 90° from a flat configuration.

21. The hinged PV module of claim 13, wherein the hinge foot is about twice, about three times, about four times, or about equal to the length of the hinge leg.

22. The hinged PV module of claim 13, wherein each PV tile further comprises a sealant material on the underside of the PV tile, arranged to be in between the midsection supports.

23. The hinged PV module of claim 13, wherein the PV tiles are configured to be held in cantilever by the flexure hinges.

24. The hinged PV module of claim 13, wherein the support skeleton has a tail end flange that is configured to partially support a further photovoltaic structure horizontally adjacent to the PV module.

25. A hinged photovoltaic (PV) module comprising:
two or more PV tiles, each PV tile having at least one solar cell;
a support skeleton, comprising:
a spine structure defining a longitudinal axis;
a plurality of midsection supports, extending from the spine, configured to extend under gaps between the two or more PV tiles; and
one or more flexure hinges extending from the spine, each flexure hinge having a hinge foot configured to secure to a roof deck and a hinge leg configured to bond to one of the PV tiles, wherein the PV tiles are configured to be held in cantilever by the flexure hinges.

26. The hinged PV module of claim 25, wherein the support skeleton is formed of a polymer, the polymer being a polyphenyl ether, a polystyrene, a polyethylene, a poly (methyl methacrylate), an acetyl, an acetal, a nylon, a polycarbonate, or a combination thereof.

27. The hinged PV module of claim 25, wherein each section of the support skeleton is about two millimeters (2 mm) thick.

28. The hinged PV module of claim 25, comprising three PV tiles, wherein each PV tile is bonded to two flexure hinges.

29. The hinged PV module of claim 25, wherein the spine further comprises an inline-brace positioned between adjacent PV tiles.

30. The hinged PV module of claim 25, wherein the hinge leg and hinge foot of the flexure hinge are connected by a bridge structure.

31. The hinged PV module of claim 25, wherein the hinge leg further comprises stiffening ribs that extend along of the length of the hinge leg, wherein the stiffening ribs are from about 25% to about 95% of the length of the hinge leg.

32. The hinged PV module of claim 25, wherein the hinge leg is from about 25% to about 100% of the length of the hinge foot.

33. The hinged PV module of claim 25, wherein the flexure hinge has a range of motion allowing for bending up to 90° from a flat configuration.

34. The hinged PV module of claim 25, wherein the hinge foot is about twice, about three times, about four times, or about equal to the length of the hinge leg.

35. The hinged PV module of claim 25, wherein each PV tile further comprises a sealant material on the underside of the PV tile, arranged to be in between the midsection supports.

36. The hinged PV module of claim 25, wherein the support skeleton has a tail end flange that is configured to partially support a further photovoltaic structure horizontally adjacent to the PV module.

* * * * *